United States Patent [19]
Mori et al.

[11] Patent Number: 6,064,585
[45] Date of Patent: May 16, 2000

[54] SEMICONDUCTOR DEVICE AND METHOD FOR FABRICATING THE SAME, MEMORY CORE CHIP AND MEMORY PERIPHERAL CIRCUIT CHIP

[75] Inventors: Toshiki Mori, Ibaraki; Ichiro Nakao, Kadoma; Tsutomu Fujita, Hirakata; Reiji Segawa, Kadama, all of Japan

[73] Assignee: Matsushita Electric Industrial Co., Osaka, Japan

[21] Appl. No.: 09/140,968

[22] Filed: Aug. 26, 1998

Related U.S. Application Data

[62] Division of application No. 08/549,097, Oct. 6, 1995, Pat. No. 5,838,603.

[30] Foreign Application Priority Data

Oct. 11, 1994 [JP] Japan .................................. 6-245312

[51] Int. Cl.⁷ .................................................. G11C 5/06
[52] U.S. Cl. .............................................. 365/63; 365/51
[58] Field of Search ......................... 365/63, 51, 230.03, 365/220

[56] References Cited

U.S. PATENT DOCUMENTS

| | | | |
|---|---|---|---|
| 4,694,433 | 9/1987 | Wiedmann | 365/230 |
| 5,033,025 | 7/1991 | Padgaonkar | 365/189.05 |
| 5,053,993 | 10/1991 | Miura | 365/104 |
| 5,096,852 | 3/1992 | Hobson | 437/207 |
| 5,134,582 | 7/1992 | Ishii | 365/189.08 |
| 5,184,321 | 2/1993 | Konishi et al. | 365/51 |
| 5,208,782 | 5/1993 | Sakuta et al. | 365/230.03 |
| 5,357,478 | 10/1994 | Kikuda et al. | 365/51 |
| 5,375,084 | 12/1994 | Begun et al. | 365/63 |
| 5,430,686 | 7/1995 | Tokami et al. | 365/230.08 |
| 5,815,427 | 9/1998 | Cloud et al. | 365/63 |
| 5,818,782 | 10/1998 | Kotani et al. | 365/63 |

FOREIGN PATENT DOCUMENTS

| | | |
|---|---|---|
| 0387834 | 9/1990 | European Pat. Off. . |
| 0644547 | 3/1995 | European Pat. Off. . |
| 0675491 | 10/1995 | European Pat. Off. . |
| 58-148992 | 9/1983 | Japan . |
| 01161859 | 6/1989 | Japan . |
| 0266965 | 3/1990 | Japan . |
| 4116859 | 4/1992 | Japan . |
| 9320654 | 10/1993 | Rep. of Korea . |

OTHER PUBLICATIONS

European Search Report related to European Patent Application No. 95115876.5–2210 dated Jul. 9, 1998.
KR Office Action Dated Aug. 28, 1998 for KR Application No. 95–35504.

*Primary Examiner*—Son T. Dinh
*Attorney, Agent, or Firm*—Renner, Otto, Boisselle & Sklar

[57] ABSTRACT

The semiconductor device of the invention includes a plurality of circuit blocks including a first circuit block and a second circuit block, a block parameter of the first circuit block being different from a block parameter of the second circuit block. In the semiconductor device, the first circuit block is formed on a first semiconductor chip, and the second circuit block is formed on a second semiconductor chip and is electrically connected with the first circuit block.

7 Claims, 20 Drawing Sheets

FIG.17

|  | System1 | System2 | System3 |
|---|---|---|---|
|  | Discrete | MCM widely used chip | This invention |
| Power voltage | 3.3V (1.0) | 3.3V (1.0) | 1.9V (0.58) |
| Power consumption | 957mW (1.0) | 937mW (0.98) | 244mW (0.26) |
| Mounting area | 2,770mm$^2$ (1.0) | 1,450mm$^2$ (0.52) | 1,110mm$^2$ (0.40) |
| Chip cost | ¥4,660 (1.0) | ¥4,370 (0.98) | ¥4,430 (1.20) |
| Clock | 20MHz (1.0) | 20MHz (1.0) | 10MHz (0.5) |
| System cost | ¥16,000 (1.00) | ¥16,000 (1.00) | ¥14,400 (0.9) |
| Note | *Data bus width: 8bits | | *Data bus width: 16 bits<br>*Parallel processing |

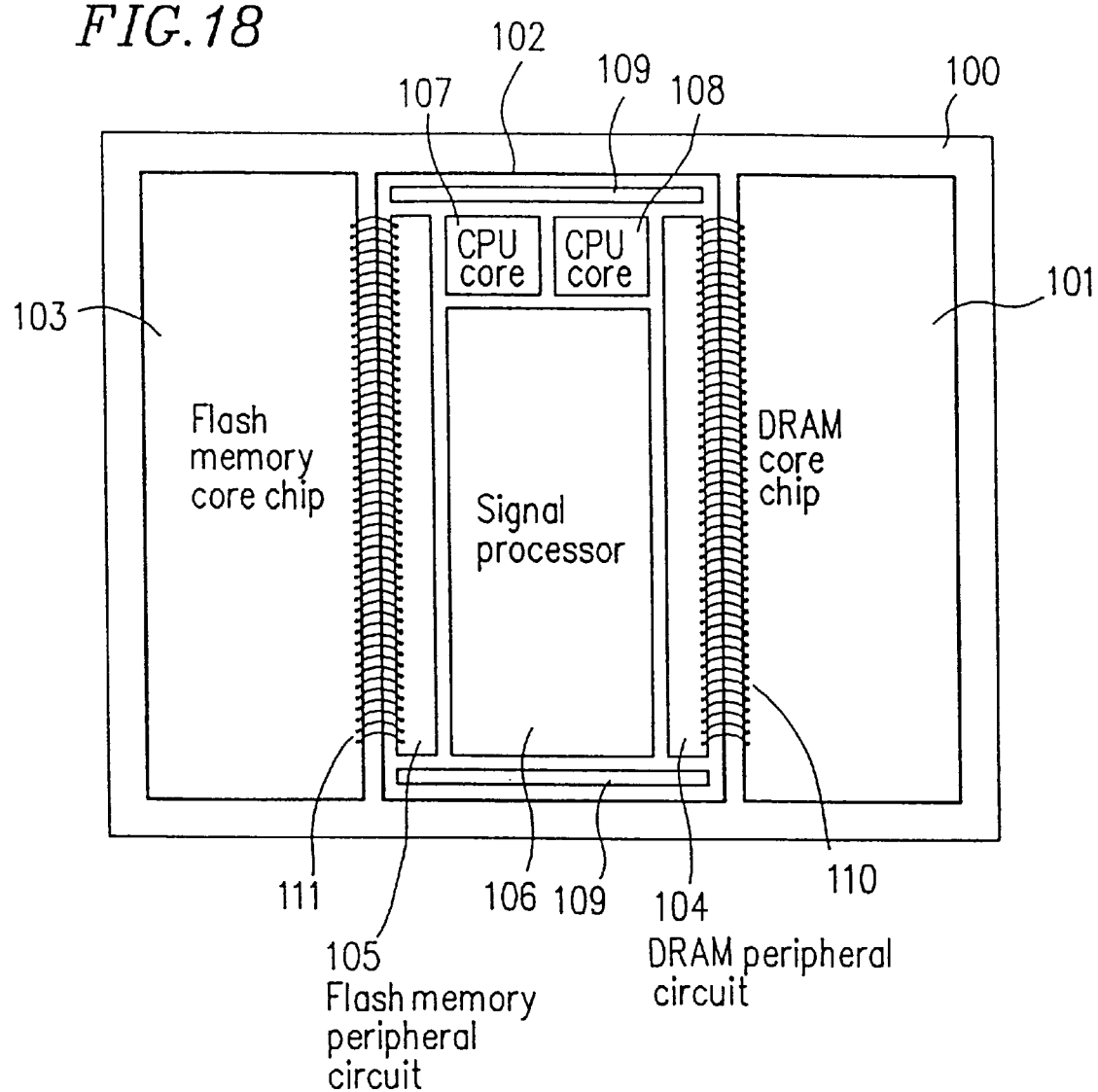

SEMICONDUCTOR DEVICE AND METHOD FOR FABRICATING THE SAME, MEMORY CORE CHIP AND MEMORY PERIPHERAL CIRCUIT CHIP

This is a division of application Ser. No. 08/549,097, filed Oct. 6, 1995 now U.S. Pat. No. 5,838,603.

BACKGROUND OF THE INVENTION

1. Field of the Invention

The present invention relates to a semiconductor memory device and a semiconductor device including a semiconductor memory device. More specifically, the present invention relates to a semiconductor memory device which can be effectively fabricated using multi chip module (hereinafter, simply referred to as an "MCM") technologies and a semiconductor device including such a semiconductor memory device.

2. Description of the Related Art

A dynamic random access memory (DRAM) device is a widely used semiconductor memory device. A DRAM generally includes a memory cell array including a plurality of memory cells arranged in an array as a memory section. In order to reduce the number of pins used for a package of a DRAM, a chip having a circuit configuration shown in FIG. 1 is generally formed. As shown in FIG. 1, the DRAM 95 includes a circuit block 50 where a memory cell array 1 including a plurality of memory cells arranged in an array is provided as a center section, and the following circuits are laid out at the same pitch as the pitch for the plurality of memory cells inside the memory cell array 1: a row decoder 5 and a word driver 6 for selecting a word line; a sense amplifier 4 for amplifying a signal on a bit line; a column selector 3 for selecting a bit data at an arbitrary position from the signal amplified by the sense amplifier 4 so as to output the selected data to a data line; and a column decoder 2 for generating a select signal to be supplied to the column selector 3. Hereinafter, such a circuit block 50 including the memory cell array 1 and the above circuits laid out at the same pitch as the pitch for the plurality of memory cells inside the memory cell array 1 will be called a "memory core section". Furthermore, the following circuits are laid out without depending upon the memory cell pitch inside the memory cell array 1: a row address buffer 10 for receiving a row address from an address signal A(10:0) input terminal 32; a column address buffer 9 for receiving a column address through the same terminal 32; a row address counter 11 for generating a refresh address; a row pre-decoder 8 for decoding an input address signal beforehand so as to convert the signal output from the row address buffer 10 into a signal applied to the row decoder 5; a column pre-decoder 7 for decoding an input address signal beforehand so as to convert the signal output from the column address buffer 9 into a signal applied to the column decoder 2; a data input buffer 12 for inputting a data to a data DQ(7:0) input terminal 36; a data output buffer 13 for outputting a data from the data DQ(7:0) output terminal 36; a write amplifier 14 for writing a data onto a memory cell; a read amplifier 15 for reading out a data from a memory cell; an RAS/CAS-clock generator 16 for generating a timing signal used inside the DRAM based on an RAS signal and a CAS signal input through an RAS signal input terminal 30 and a CAS signal input terminal 31, respectively; a WE-clock generator 17 for generating a write timing signal based on a WE signal input through a WE signal input terminal 35; an OE-clock generator 18 for generating a timing signal for an output data based on an OE signal input through an OE signal input terminal 37; a boosting potential generator 19 for generating a voltage required for the inside of the DRAM so as to boost a word line potential; a substrate potential generator 20 for generating a potential applied to a substrate; and a ½ VCC generator 21 for generating a ½ VCC required as a potential applied to a bit line pre-charge and a cell plate. Hereinafter, the above circuits laid out without depending upon the memory cell pitch inside the memory cell array 1 will be called a "memory peripheral circuit section" as a whole.

Since the DRAM 95 includes on one chip the above-described circuits shown in FIG. 1, only address pins, data pins, several control signal pins and power supply pins are necessary as external pins for mounting the DRAM on a package. Therefore, the DRAM can be mounted on a small package. For example, in an eight bit data I/O 16 Mbit DRAM, 11 address pins, 8 data input/output pins, 4 control signal pins and 2 power supply pins, i.e., 25 pins in total, are used. Accordingly, such a DRAM can be mounted on a package with 28 pins.

FIG. 2 shows an exemplary layout for the DRAM (16 Mbit DRAM in this case) having the circuit configuration shown in FIG. 1. As shown in FIG. 2, the memory cell array 1 is divided into four 4 Mbit plates, and each 4 Mbit plate is further divided into sixteen 256 Kbit memory cell blocks. Each 256 Kbit memory cell block 96 includes memory cells in 256 rows×1024 columns. The number of sense amplifiers 4 and column selectors 3 provided for each memory cell block is the same as the number of the columns of the memory cell, i.e., 1024. The row decoder 5 and the word driver 6 are provided for each memory cell block; the column decoder 2 is provided for each plate; and the memory peripheral circuit section is disposed in the portion 94 between the right and left side column decoders 2 in the center portion of the chip and in the peripheral portion of the chip. In this case, the select signal output from the column decoder 2 to the column selector 3 is a signal commonly used for the plates on right and left sides. Because the select signal line cannot cross the memory peripheral circuit section 94 in the center portion, the column decoders 2 are disposed on right and left plates respectively. Pads used for connecting the chip with external pins are disposed in pad formation sections 40 in the center portion 94 of the chip. These pads and the external pins of the package are connected with a wire bond.

In this case, the terminal capacitance of the data input/output terminal 36 for inputting/outputting the data becomes the largest among the terminal capacitances of the respective signal terminals 30 to 32 and 35 to 37 when the chip is mounted on the package. A total terminal capacitance, obtained by adding the gate capacitance of an input transistor; a line capacitance from the terminals to the input transistor; a capacitance of a device for protecting the input transistor from an electric surge; a diffusion capacitance of a signal output transistor; a capacitance of a device for protecting the output transistor from an electric surge; and capacitances of a lead and a wire bond of the package, approximately 5 pF. A plurality of memory devices are generally provided for a system, and the respective terminals of the plurality of memory devices are commonly connected with each other via bus lines. Accordingly, the characteristics of a DRAM are generally estimated assuming that a load capacitance of 50 pF is connected with the respective pins. Currently, a data I/O with a bit width of about 8 to 16 bits is practically used in consideration of not only the limitation of the number of the package pins but also the increase in the power consumption and the noise caused by the load capacitance drive.

FIG. 3 shows an embodiment of a system using a DRAM. In FIG. 3, a packaged DRAM 72 and signal processing LSI 71 such as a CPU are soldered together with a printed wiring board 70. The DRAM 72 and the signal processing LSI 71 are connected with each other via a printed wiring 73. FIG. 3 shows a configuration of a system using one DRAM. However, a large number of systems use a plurality of DRAMs.

A DRAM is fabricated by performing complicated semiconductor fabrication processes having a large number of process steps in order to fabricate a small-area and large-capacity memory cell capacitor or a memory cell transistor with a small amount of leakage current. Accordingly, the fabrication cost of the DRAM using a 0.5 μm design rule is about 1.5 times as high as the fabrication cost of a logic LSI fabrication process for forming a logic LSI using the same design rule.

In the DRAM having the circuit configuration shown in FIG. 1, the DRAM fabrication process is necessary only for the memory cell array 1, and the components other than the memory cell array 1 on the chip can be fabricated using the logic LSI process for forming a logic LSI. However, as shown in FIG. 2, all the components of the DRAM having the circuit configuration shown in FIG. 1 are fabricated using the DRAM fabrication process, so that the fabrication cost of the DRAM becomes disadvantageously high.

This is true of semiconductor memory devices other than the DRAM. In an SRAM, an EEPROM, a flash memory and the like, the portion including the peripheral circuit section other than the memory cell array is formed on one chip using processes requiring a higher cost as compared with a logic LSI fabrication process, thereby further increasing the cost of the semiconductor memory device.

In addition, as described above, the bit width of the data I/O generally used for a memory device is as small as 8 to 16 bits. Therefore, in a system for transmitting a data with a large bit width, the data I/O with a large bit width is formed using a large number of memory devices with a small capacity. As a result, such a system becomes large scale and requires a higher cost.

On the other hand, as a small-sized and faster response system has been developed, MCM technologies for mounting a plurality of bare chips including memory devices on one and the same substrate and connecting the chips with a shortest wiring has been developed. However, in the memory chip used for such an MCM, the expensive memory devices fabricated in a conventional configuration shown in FIG. 2 are used, and the bit width of the data I/O on one memory chip is limited. Therefore, in order to realize a large bit width data I/O, it is necessary to use a large number of memory devices with a small capacity.

Furthermore, in order to improve the data storage characteristics of the memory cells and accelerate the access time, the potential of the semiconductor substrate of a DRAM is set to be negative. This negative potential is generated by a substrate potential generator 20 integrated on the DRAM chip. On the other hand, the semiconductor substrate used for a logic LSI is generally grounded. Therefore, the impedance of the semiconductor substrate for the DRAM becomes higher than the impedance of the semiconductor substrate for the logic LSI, so that the latch up and the electric surge resistance of the DRAM are degraded. As a result, a large area section for protecting the input from an electric surge is required, and a triple well structure process where only the memory cell region on the substrate is set to be at a negative potential is required for a DRAM fabricated by a fine patterning process, thereby further increasing the cost of the DRAM.

Moreover, in a system using memory devices, plural kinds of memory devices, not only the DRAM but also an SRAM, an EEPROM, a flash memory and the like, are frequently used. In all these memory devices, the peripheral circuits are mounted on one and the same chip where the memory cells are mounted, so that every memory chip includes the circuits operating in the same manner.

SUMMARY OF THE INVENTION

The semiconductor device of the invention includes a plurality of circuit blocks including a first circuit block and a second circuit block, a block parameter of the first circuit block being different from a block parameter of the second circuit block. In the semiconductor device, the first circuit block is formed on a first semiconductor chip, and the second circuit block is formed on a second semiconductor chip and is electrically connected with the first circuit block.

According to another aspect of the present invention, a method for fabricating a semiconductor device is provided. The method includes the steps of: grouping a plurality of circuits which are integratable on one and the same semiconductor chip into a first circuit block and a second circuit block, a block parameter of the first circuit block being different from a block parameter of the second circuit block; forming the first circuit block on a first s emiconductor chip; forming the second circuit block on a second semiconductor chip; and electrically connecting the first circuit block with the second circuit block.

In one embodiment, the first circuit block is a memory cell block including a plurality of memory cells, and the second circuit block is a memory peripheral circuit block for accessing selected memory cells of the memory cell block.

In another embodiment, the first circuit block is a CPU core, and the second circuit block is a peripheral circuit block.

According to still another aspect of the present invention, a semiconductor device including a plurality of circuits, which are integratable on one and the same semiconductor chip, grouped into a first circuit block and a second circuit block is provided. In the semiconductor device, a block parameter of the first circuit block is different from a block parameter of the second circuit block. The first circuit block is formed on a first semiconductor chip, and the second circuit block is formed on a second semiconductor chip and is electrically connected with the first circuit block.

According to still another aspect of the present invention, a semiconductor device including a first circuit section having a plurality of circuit blocks for performing at least a first function, and a second circuit section having a circuit block for performing a second function which is different from the first function is provided. In the semiconductor device, at least one circuit block of the plurality of circuit blocks of the first circuit section is formed on a first semiconductor chip together with the circuit block of the second circuit section, and the other circuit blocks of the first circuit section are formed on a second semiconductor chip which is different from the first semiconductor chip, and the other circuit blocks are electrically connected with the circuit block formed on the second semiconductor chip, and a block parameter concerning the at least one circuit block of the first circuit section formed on the first semiconductor chip is closer to a block parameter concerning the circuit block of the second circuit section as compared with a block parameter concerning the other circuit blocks of the first circuit section formed on the second semiconductor chip.

In one embodiment, the first circuit section at least includes a memory cell block and a memory peripheral circuit block as the plurality of circuit blocks for performing the first function, and the second circuit section includes a signal processor as the circuit block for performing the second function, and the signal processor and the memory peripheral circuit block are formed on the first semiconductor chip and the memory cell block is formed on the second semiconductor chip.

In another embodiment, the block parameter is a parameter selected from the group consisting of: an operational clock frequency; a design rule; a threshold value (Vt) of a transistor; a power voltage; whether the circuit block consists of digital circuits or analog circuits; whether the circuit block is an ordinary MOS circuit, a CMOS circuit, a bipolar circuit, or a bi-CMOS circuit; whether the circuit block is a ROM or a RAM; and whether the circuit block is a logic circuit or a memory.

According to still another aspect of the present invention, a memory peripheral circuit section chip is provided. The memory peripheral circuit section chip includes: an input/output terminal for transmitting/receiving a signal to/from another semiconductor memory core chip having a memory cell array, and a memory peripheral circuit for designating a memory cell of the memory cell array in the semiconductor memory core chip based on a given address so as to read/write a data from/onto the memory cell.

According to still another aspect of the present invention, a memory core chip is provided. The memory core chip includes: an input/output terminal for transmitting/receiving a signal to/from another semiconductor chip having a memory peripheral circuit, and a memory cell array. In the memory core chip, a memory cell is designated by the memory peripheral circuit of the semiconductor chip based on a given address so as to read/write a data from/onto the memory cell.

According to still another aspect of the present invention, a semiconductor memory device is provided. The semiconductor memory device includes: at least one memory core section chip formed by performing a first semiconductor fabrication process; a memory peripheral circuit section chip formed by performing a second semiconductor fabrication process which is different from the first semiconductor fabrication process; and a means for connecting the memory core section chip with the memory peripheral circuit section chip.

In one embodiment, the memory core section chip includes a memory cell for storing a data therein, and the memory peripheral circuit section chip designates the memory cell in the memory core section chip based on a given address so as to read/write a data from/onto the memory cell.

According to still another aspect of the present invention, a semiconductor memory device is provided. The semiconductor memory device includes: a plurality of memory core section chips formed by performing a first semiconductor fabrication process; a memory peripheral circuit section chip formed by performing a second semiconductor fabrication process different from the first semiconductor fabrication process; and a means for connecting the plurality of memory core section chips with the memory peripheral circuit section chip. In the semiconductor memory device, the plurality of memory core section chips commonly use at least a part of circuits included in the memory peripheral circuit section chip.

According to still another aspect of the present invention, a semiconductor device is provided. The semiconductor device includes: at least one memory core section chip including a memory cell, formed by performing a first semiconductor fabrication process, for storing a data therein; a signal processing chip including a memory peripheral circuit section formed by performing a second semiconductor fabrication process which is different from the first semiconductor fabrication process, and a signal processor for processing a signal using the data stored in the memory core section chip; and a means for connecting the memory core section chip with the signal processing chip.

In one embodiment, the memory peripheral circuit section designates the memory cell in the memory core section chip based on a given address so as to read/write a data from/onto the memory cell.

In another embodiment, a plurality of the memory core section chips are provided, and commonly use at least a part of circuits of the memory peripheral circuit section.

According to still another aspect of the present invention, a semiconductor device is provided. The semiconductor device includes a memory chip and a signal processing chip which are mounted on one and the same substrate. In the semiconductor device, the memory chip includes: a memory cell array section including a plurality of memory cells for storing a data therein; an access means for designating a memory cell in the memory cell array section based on a given address so as to input/output data thereto/therefrom; and a data terminal for inputting/out-putting a plurality of data in parallel; the signal processing chip includes a data terminal for inputting/outputting a plurality of data in parallel; and a means for transmitting a plurality of data in parallel between the memory chip and the signal processing chip is provided.

In one embodiment, the memory chip is formed by performing a first semiconductor fabrication process, and the signal processing chip is formed by performing a second semiconductor fabrication process which is different from the first semiconductor fabrication process.

In another embodiment, the signal processing chip further includes a plurality of signal processors.

According to still another aspect of the present invention, a semiconductor device is provided. The semiconductor device includes a memory core section chip and a signal processing chip which are mounted by utilizing multi-chip module mounting technologies. In the semiconductor device, the memory core section chip includes: a memory cell array including a plurality of memory cells for storing a data therein; and a data terminal for inputting/outputting a plurality of data in parallel; the signal processing chip includes a data terminal for designating a memory cell in the memory core section chip based on a given address so as to read/write a data from/onto the memory cell and input/output a plurality of data in parallel, and a plurality of signal processors; and a means for transmitting a plurality of data in parallel between the memory core section chip and the signal processing chip is provided.

In one embodiment, the memory core section chip is formed by performing a first semiconductor fabrication process, and the signal processing chip is formed by performing a second semiconductor fabrication process which is different from the first semiconductor fabrication process.

Thus, the invention described herein makes possible the advantage of providing a high-performance semiconductor device at a lower cost.

This and other advantages of the present invention will become apparent to those skilled in the art upon reading and understanding the following detailed description with reference to the accompanying figures.

BRIEF DESCRIPTION OF THE DRAWINGS

FIG. 16A is a graph showing a power voltage dependence of the logic gate delay time, while

FIG. 17 is a table showing in comparison various characteristics of respective exemplary systems.

FIG. 18 is a plan view showing an exemplary configuration for a semiconductor device according to a sixth example of the present invention.

FIG. 20A is a block diagram schematically showing a configuration for a controller MCU, while

FIG. 21A illustrates a method for grouping the circuit blocks with respect to the controller MCU and the video processing MCU, while

FIG. 22A illustrates a method for grouping the circuit blocks with respect to the controller MCU and the video processing MCU, while

DESCRIPTION OF THE PREFERRED EMBODIMENTS

A semiconductor device of the invention includes a plurality of circuit blocks including at least a first circuit block and a second circuit block which have different block parameters. The first circuit block is formed on a first semiconductor chip, while the second circuit block is formed on a second semiconductor chip. The "block parameter" herein refers to various differences between these two circuit blocks, e.g., an operational clock frequency; a design rule; a threshold value (Vt) of a transistor; a power voltage; whether the circuit block consists of digital circuits or analog circuits; whether the circuit is an ordinary MOS circuit, a CMOS circuit, a bipolar circuit, or a bi-CMOS circuit; and the like. The block parameter further includes differences in the logic characteristics: whether the circuit is a ROM or a RAM; whether the circuit is a logic circuit or a memory; and the like.

In recent years, a so-called "system-on-chip" has become the dominant idea in fabricating a semiconductor device on a chip. In the system-on-chip, a large-scale system is formed on one and the same chip, thereby improving various characteristics of the system such as the operational speed, and reducing the production cost of the system. In such a system-on-chip type semiconductor device, a plurality of circuit blocks are integrated on one and the same semiconductor chip, and the semiconductor device is designed so that the plurality of circuit blocks are arranged in an optimal layout. In some cases, the plurality of circuit blocks to be integrated have respectively different parameters. However, it has generally been believed to be most preferable that the plurality of circuit blocks are integrated on one and the same semiconductor chip. The present inventors suspected the common sense in the art to be problematic, and have found that the production cost can be effectively reduced by classifying a plurality of circuit blocks into several groups based on various parameters and distributing the respective groups of circuit blocks on different semiconductor chips, to the contrary of the prevailing common sense.

In grouping and distributing the plurality of circuit blocks, it is important to determine the criteria for grouping the circuit blocks and forming the blocks on the respective semiconductor chips. This point will be described with reference to FIGS. 4A to 4C.

Figure 4C:
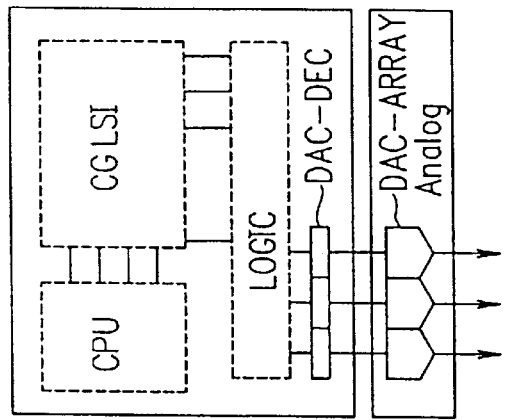
FIG. 4C schematically shows a layout of a semiconductor device, where these circuit blocks are classified into two groups based on the block parameter of whether each circuit block is digital or analog, and the respective circuit blocks are re-arranged on two different semiconductor chips.
Figure 4B:
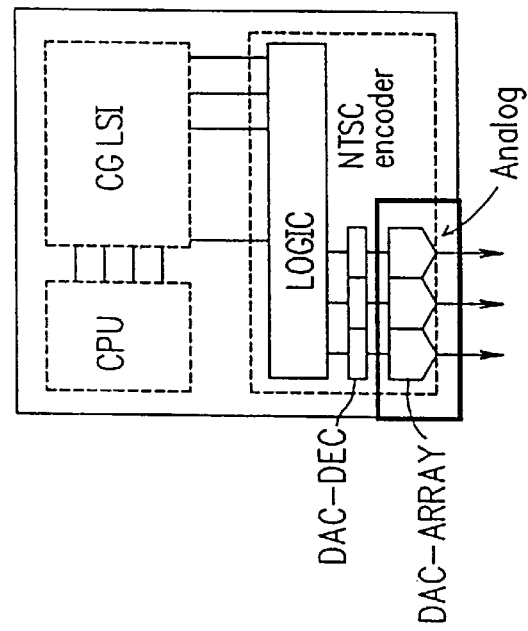
FIG. 4B schematically shows a layout of a semiconductor device including these circuit blocks integrated on one and the same semiconductor chip.
Figure 4A:
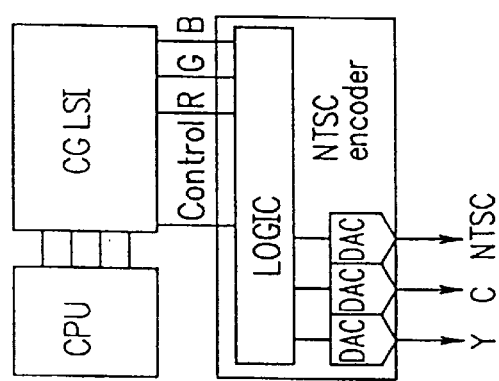
FIG. 4A shows a plurality of circuit blocks grouped based on generally used functional criteria.

FIG. 4A shows a plurality of circuit blocks grouped based on generally used functional criteria; FIG. 4B schematically shows a layout of a semiconductor device including these circuit blocks integrated on one and the same semiconductor chip; and FIG. 4C schematically shows a layout of a semiconductor device, where these circuit blocks are classified into two groups based on the block parameter of whether each circuit block is digital or analog, and the respective circuit blocks are re-arranged on two different semiconductor chips.

As shown in FIG. 4A, a video processing system usable for a home-use game apparatus or the like includes: a CPU;

a video processing LSI for computer graphics (CG); and an NTSC encoder. The NTSC encoder includes a logic circuit (LOGIC) section and a D/A converter (DAC) section. These two sections function as an NTSC encoder as a whole. The LOGIC section controls an output level of the DAC section based on RGB digital signals. The DAC section includes a decoder section (DAC-DEC) for decoding the digital signals, and a current cell array section (DAC-ARRAY) for outputting an analog signal in response to the signals supplied from the decoder section. The DAC-DEC consists of digital circuits while the DAC-ARRAY consists of analog circuits. As a result, the NTSC encoder can produce an NTSC composite signal from the RGB digital signals. The CPU, the video processing LSI and the NTSC encoder are respectively formed on different semiconductor chips. Each semiconductor chip is disposed on a circuit board, and the respective semiconductor chips are electrically connected with each other via the lines provided on the circuit board. The interconnection using the lines on the circuit board is regarded as an obstacle for a high-speed operation of the system. Therefore, thanks to the development in the large-scale LSI fabrication technologies and the design aiding tools using a CAD system, the system shown in FIG. 4A tends to be integrated on one and the same semiconductor chip as shown in FIG. 4B.

According to an embodiment of the present invention, the circuit blocks of the system are grouped based on the block parameter of whether the circuit block is digital or analog, and then distributed on different semiconductor chips. More specifically, the LOGIC section and digital circuits of the DAC section in the NTSC encoder are separated from analog circuits of the DAC section, and then integrated on one and the same semiconductor chip (for digital circuits) together with the CPU block and the CG block. On the other hand, the analog circuits of the DAC section in the NTSC encoder are formed on another semiconductor chip (for analog circuits). By arranging the circuit blocks in this manner, the following effects are obtained. The analog circuits of the DAC section in the NTSC are sensible to noise and is likely to be adversely affected by noise. Therefore, if the DAC section is formed on one and the same semiconductor chip where the LOGIC section consisting of digital circuits is formed, then the noise caused by the operation of the digital circuits possibly reaches the DAC section via the semiconductor chip. By grouping the respective circuit blocks in the above-described manner and separately forming the grouped circuit blocks on the two different semiconductor chips in order to fully make use of the function of the NTSC encoder, it is possible to eliminate such a problem caused by the noise. In addition, the process steps for forming an analog circuit and the process steps for forming a digital circuit utilize different semiconductor fabrication processes, and have respectively different design rules. Therefore, if the fabrication process for forming a semiconductor chip for digital circuits and the fabrication process for forming another semiconductor chip for analog circuits are separately performed, then it is possible to form the respective semiconductor chips while following an optimal design rule and performing a simplified production procedure with unnecessary process steps omitted. In general, a process with a strict design rule requires a relatively higher cost for performing a single process step. Accordingly, if a circuit block which can be formed following a flexible design rule is found and separated from the other circuit blocks so as to be formed on another semiconductor chip, then the fabrication cost can be reduced as a whole.

Figure 5B:
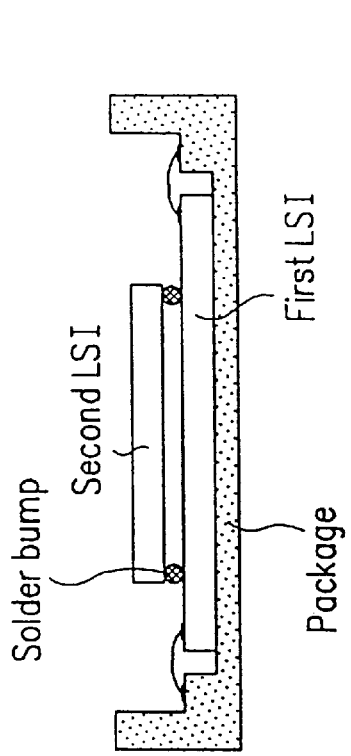
FIG. 5B is a cross-sectional view of the MCM.
Figure 5C:
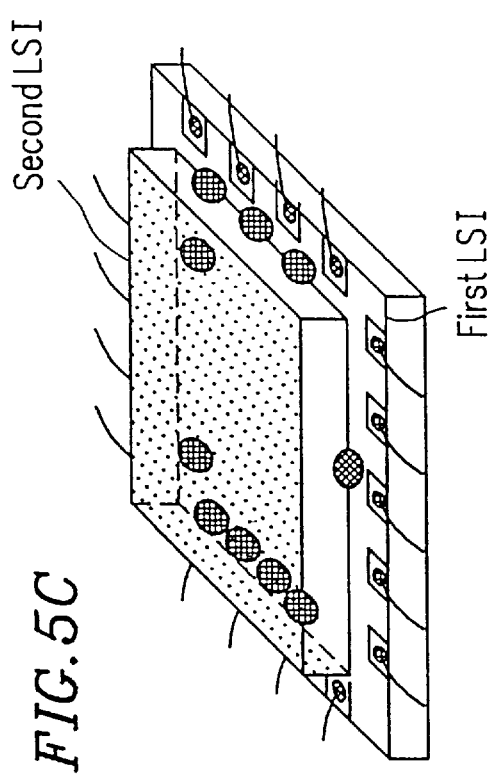
FIG. 5C is a perspective view of the MCM.
Figure 5A:
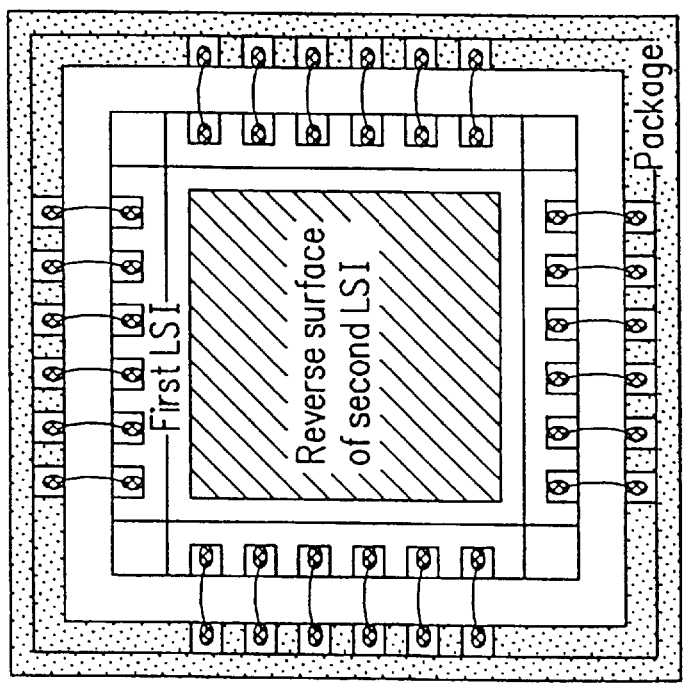
FIG. 5A is a plan view showing an MCM.

After the circuit blocks are separately formed on a plurality of semiconductor chips, an MCM is formed by connecting the plurality of semiconductor chips. An MCM is formed, for example, by disposing and interconnecting two LSI chips via solder bump as shown in FIGS. 5A to 5C. The MCM for the semiconductor device of the present invention is different from a conventional MCM in that the semiconductor device of the present invention does not include a module formed by simply combining a plurality of conventional semiconductor chips, but that the module of the invention consists of the semiconductor chips grouped based on a particular block parameter. More specifically, according to the present invention, after a system including a plurality of circuit blocks is formed, the plurality of circuit blocks are classified into a plurality of groups, each of which includes circuits blocks having a common or similar block parameter, and then the respective groups are formed on different semiconductor chips so as to constitute a module.

In another embodiment of the invention, a memory cell block including a plurality of memory cells and a memory peripheral circuit block for accessing a selected memory cell of the memory cell block are formed on different semiconductor chips. The memory cell block and the memory peripheral circuit block have different design rule (minimum size) and different sequences for the fabrication process. However, it has conventionally been believed that these blocks should be integrated on one and the same semiconductor chip in order to fully make use of the function of a DRAM. According to the present invention, the memory cell block and the peripheral circuit block are grouped based on a block parameter of a design rule, and then formed on different semiconductor chips. This aspect of the present invention will be described in detail in the examples.

In still another preferred embodiment, a CPU core and a peripheral circuit block are separately formed on different semiconductor chips. A "CPU core" herein means a unit at least including a control section for performing a control by decoding an instruction, and an operation section for performing an arithmetic and logical operation, thereby controlling peripheral circuits.

Figure 6A:
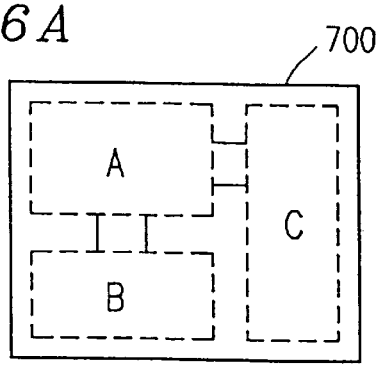
FIGS. 6A and 6B are plan views illustrating a first method for distributing a plurality of blocks.
Figure 6B:
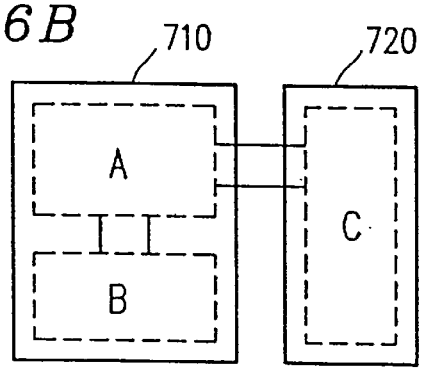

There are roughly two methods for distributing the plurality of circuit blocks. The first method is applied to the case where a plurality of circuit blocks A, B and C are formed on a single semiconductor chip 700 in order to accomplish one function as shown in FIG. 6A. According to the first method, as shown in FIG. 6B, a circuit block having a different block parameter from those of the other circuit blocks is found, and then the blocks A and B are formed on a semiconductor chip 710 and the block C is formed on another semiconductor chip 720. These two semiconductor chips 710 and 720 are connected with each other.

Figure 7A:
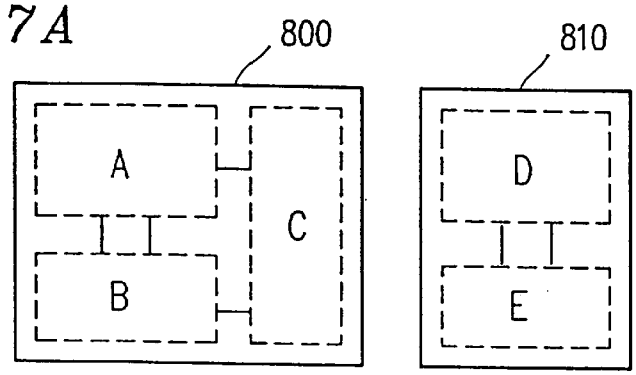
FIGS. 7A and 7B are plan views illustrating a second method for distributing a plurality of blocks.
Figure 7B:
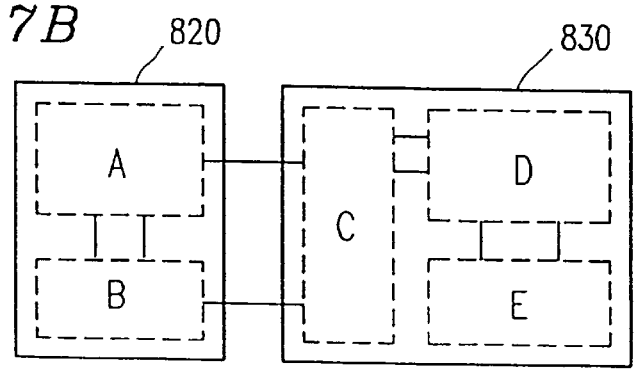

The second method is applied to the case where a plurality of circuit blocks A, B and C are formed on a first semiconductor chip 800 in order too accomplish a first function, and another plurality of circuit blocks D and E are formed on a second semiconductor chip 810 in order to accomplish a second function as shown in FIG. 7A. According to the second method, as shown in FIG. 7B, a circuit block C having a different block parameter from those of the remaining circuit blocks A and B is found, and then formed on another semiconductor chip 830. The remaining circuit blocks A and B are formed on a semiconductor chip 820. These two semiconductor chips 820 and 830 are connected with each other.

Hereinafter, referring to FIG. 8, a method for fabricating a semiconductor device according to the present invention will be described.

Figure 8:
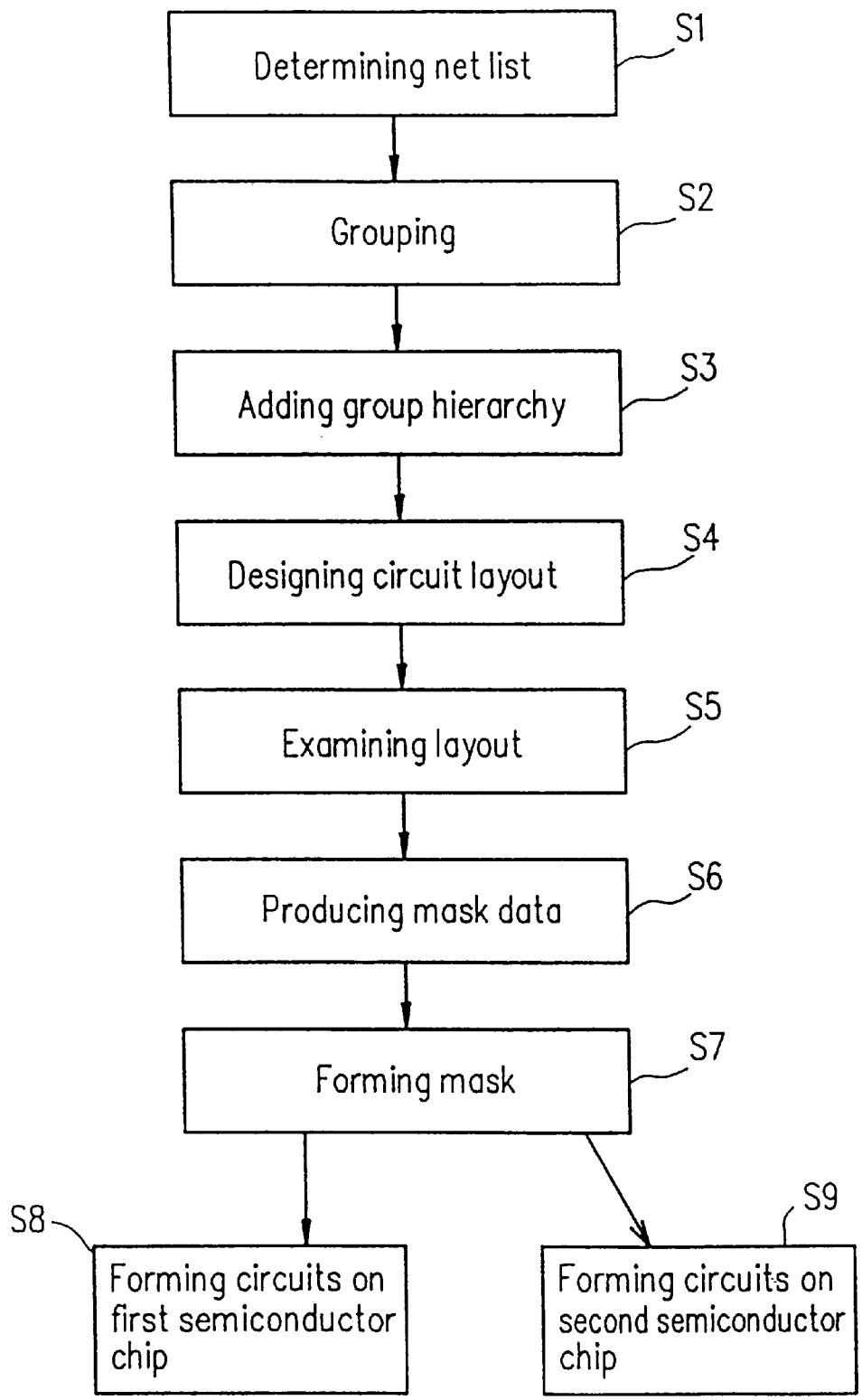
FIG. 8 is a flow chart showing a method for fabricating a semiconductor device according to the present invention.

First, in Step 1 shown in FIG. 8, a net list is determined using a CAD system, a block parameter is read, and then the hierarchies of the respective circuit blocks are classified. Next, in Step 2, the circuit blocks are grouped based on a particular block parameter. Then, in Step 3, a group hierarchy is added to the net list, thereby completing the distribution of the circuit blocks among a plurality of semiconductor chips.

From Step 4 on, known process steps for fabricating semiconductor chips are performed. More specifically, the layout of the circuits to be formed on the respective semiconductor chips is determined in Step 4; the layout is examined in Step 5; a mask data is produced in Step 6; a mask is formed in Step 7; and then the circuits are formed on respective semiconductor chips using the mask in Steps 8 and 9. Steps 8 and 9 include a plurality of sub-process steps such as a thin film deposition process step and a photolithography process step.

The two semiconductor chips thus formed are connected with each other preferably by MCM technologies, so as to form one semiconductor device.

Next, it will be described what kinds of effects can be obtained by grouping the circuit blocks based on a particular kind of block parameter, with reference to the following Tables 1 to 5. Tables 1 to 5 show the respective circuits which are classified into two different groups of circuit blocks based on the respective block parameters and then formed on the first semiconductor chip (LSI-1) and the second semiconductor chip (LSI-2).

TABLE 1

[when block parameter is design rule]

|   | LSI-1 | LSI-2 |
|---|---|---|
| 1 | peripheral circuit | memory core |
| 2 | digital circuit | analog circuit |
| 3 | high-speed circuit | low-speed circuit |
| 4 | CMOS circuit | bipolar circuit |
| 5 | user circuit | MCU core |
| 6 | test circuit | non-test circuit |

TABLE 2

[when block parameter is threshold value (Vt)]

|   | LSI-1 | LSI-2 |
|---|---|---|
| 1 | high-speed circuit | low-speed circuit |
| 2 | peripheral circuit | memory core |
| 3 | digital circuit | analog circuit |

TABLE 3

[when block parameter is power voltage]

|   | LSI-1 | LSI-2 |
|---|---|---|
| 1 | peripheral circuit | memory core |
| 2 | user circuit | MCU core |
| 3 | digital circuit | analog circuit |
| 4 | user circuit | MCU core |

TABLE 4

[when block parameter is operational frequency]

|   | LSI-1 | LSI-2 |
|---|---|---|
| 1 | user circuit | MCU core |
| 2 | memory | MCU core |
| 3 | high-speed circuit | low-speed circuit |
| 4 | test circuit | non-test circuit |

TABLE 5

[when block parameter is logic circuit characteristic]

|   | LSI-1 | LSI-2 |
|---|---|---|
| 1 | user circuit | MCU core |
| 2 | calculator (FPU, etc.) | MCU core |
| 3 | memory | MCU core |
| 4 | user circuit | calculator (FPU, etc.) |
| 5 | user circuit | memory |
| 6 | digital circuit | analog circuit |
| 7 | CMOS circuit | bipolar circuit |
| 8 | test circuit | non-test circuit |

As shown on the first line of Table 1, when the design rule is selected as the block parameter, peripheral circuits such as row decoders and column decoders are formed on the first semiconductor chip and the memory core circuit section including a large number of memory cells arranged in an array is formed on the second semiconductor chip. These two semiconductor chips are electrically connected with each other so as to constitute one semiconductor memory device.

In the embodiments shown in Table 1, the fabrication cost for the device can be reduced. If a plurality of circuit blocks having different design rules are formed on one and the same semiconductor chip, then circuit blocks with a flexible design rule coexist with circuit blocks with a strict design rule on the same chip. In many cases, a relatively expensive fabrication apparatus is required for fabricating the circuit blocks with a strict design rule, and particular fabrication process steps are required to be additionally performed for forming a fine structure. However, if the circuit blocks with a relatively flexible design rule are separately formed on a different semiconductor chip from the chip where the circuit blocks with a relatively strict design rule are formed, then the former semiconductor chip can be formed by performing relatively inexpensive process steps, and the production yield is increased. As a result, such a semiconductor device including the two semiconductor chips can be fabricated at a lower cost and with a satisfactory production yield as a whole.

In the embodiments shown in Table 2, a semiconductor device operating at a high speed with a low power consumption can be obtained. In general, a large amount of leakage current is likely to be generated in a semiconductor device which can operate at a high speed, so that the semiconductor device tends to consume a larger amount of power. Circuit blocks with a low threshold value of a transistor operate at a relatively high speed, but the amount of leakage current generated therein is relatively large. If the circuit blocks are grouped into the circuit blocks to be operated at a relatively high speed and the circuit blocks to be operated at a relatively low speed based on the threshold value of the transistor, then it is possible to form the respective semiconductor chips by performing the semiconductor fabrication processes suitable for the respective semiconductor chips. As a result, a semiconductor device operating at a high speed with a low power consumption can be formed at a relatively low cost.

In the embodiments shown in Table 3, an optimal power voltage can be set for each of the semiconductor chips, so that a semiconductor device operating at a high speed with a low power consumption can be formed at a relatively low cost in the same way as the embodiments shown in Table 2. In general, the operational speed of a large-scale integrated circuit (LSI) is increased in proportion to the power voltage. In other words, if the power voltage decreases, then a maximum operational frequency is reduced. On the other hand, the power consumption is in proportion to the square of the power voltage. When an LSI is operated at the same frequency, the power consumed when the LSI is driven at a power voltage of 3 volts becomes approximately 40% of the power consumed when the LSI is driven at a power voltage of 5 volts. If a video processing micro controller unit (MCU) operating at a frequency of 25 MHz for a power voltage of 3 volts is formed by using MCU cores operating at a frequency of 50 MHz for a power voltage of 3 volts and at a frequency of 25 MHz for a power voltage of 2 volts, then the video processing MCU comes to operate at a relatively higher power voltage for the operational frequency thereof, so that the power is wasted. In some case, the MCU is preferably operated at a power voltage of 2 volts and the peripheral circuits are preferably operated at a power voltage of 3 volts. In such a case, if the MCU core and the peripheral circuits are formed on different semiconductor chips and different voltages are supplied to the respective semiconductor chips, then a high-speed operation of a semiconductor device is realized at a low power consumption by operating the semiconductor device at an optimal power voltage.

In the embodiments shown in Table 4, the fabrication cost of the device can be reduced. Circuit blocks operating at a relatively high operational frequency and circuit blocks operating at a relatively low operational frequency have different structures to be fabricated by performing different semiconductor fabrication processes. Therefore, by forming the respective circuit blocks on different semiconductor chips, the fabrication cost of the device can be reduced as a whole. In addition, the effects obtained in the embodiments shown in Table 2 can also be obtained in the embodiments shown in Table 4.

In the embodiments shown on the first to fifth lines of Table 5, the fabrication cost including a design cost can be reduced. In these embodiments, circuit blocks which can be widely used are formed on one of the semiconductor chips, while the arrangement of the circuits formed on the other semiconductor chip can be selected by a user. Therefore, the latter semiconductor chip can be designed and fabricated in accordance with the user's choice so as to be formed in various arrangements. However, the widely-used semiconductor chip can be commonly used for the plural kinds of semiconductor chips thus formed. Therefore, in the case of fabricating a plurality of semiconductor devices or changing the design thereof, the fabrication cost can be advantageously reduced.

In the embodiments shown on the sixth line of Table 5, the deterioration of the performance of the device caused by the noise can be prevented, as described above. In the embodiments shown on the seventh and eighth lines of Table 5, the circuits on the respective semiconductor chips can be fabricated by performing optimal semiconductor fabrication processes therefor, so that the fabrication cost can be advantageously reduced.

Hereinafter, the present invention will be described by way of illustrative examples with reference to accompanying drawings.

EXAMPLE 1

Figure 1:
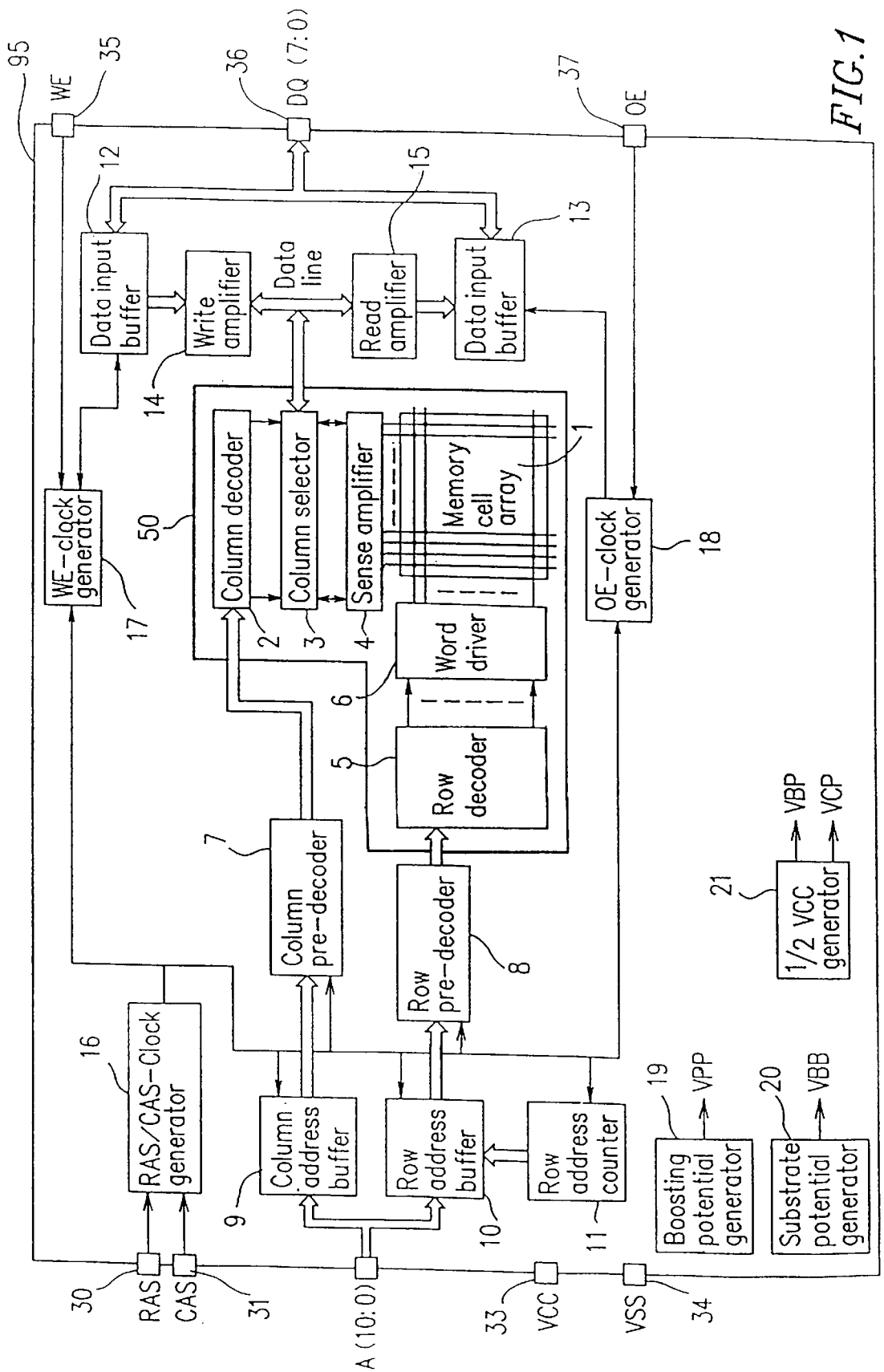
FIG. 1 is a block diagram showing an exemplary circuit configuration for a conventional DRAM.
Figure 9:
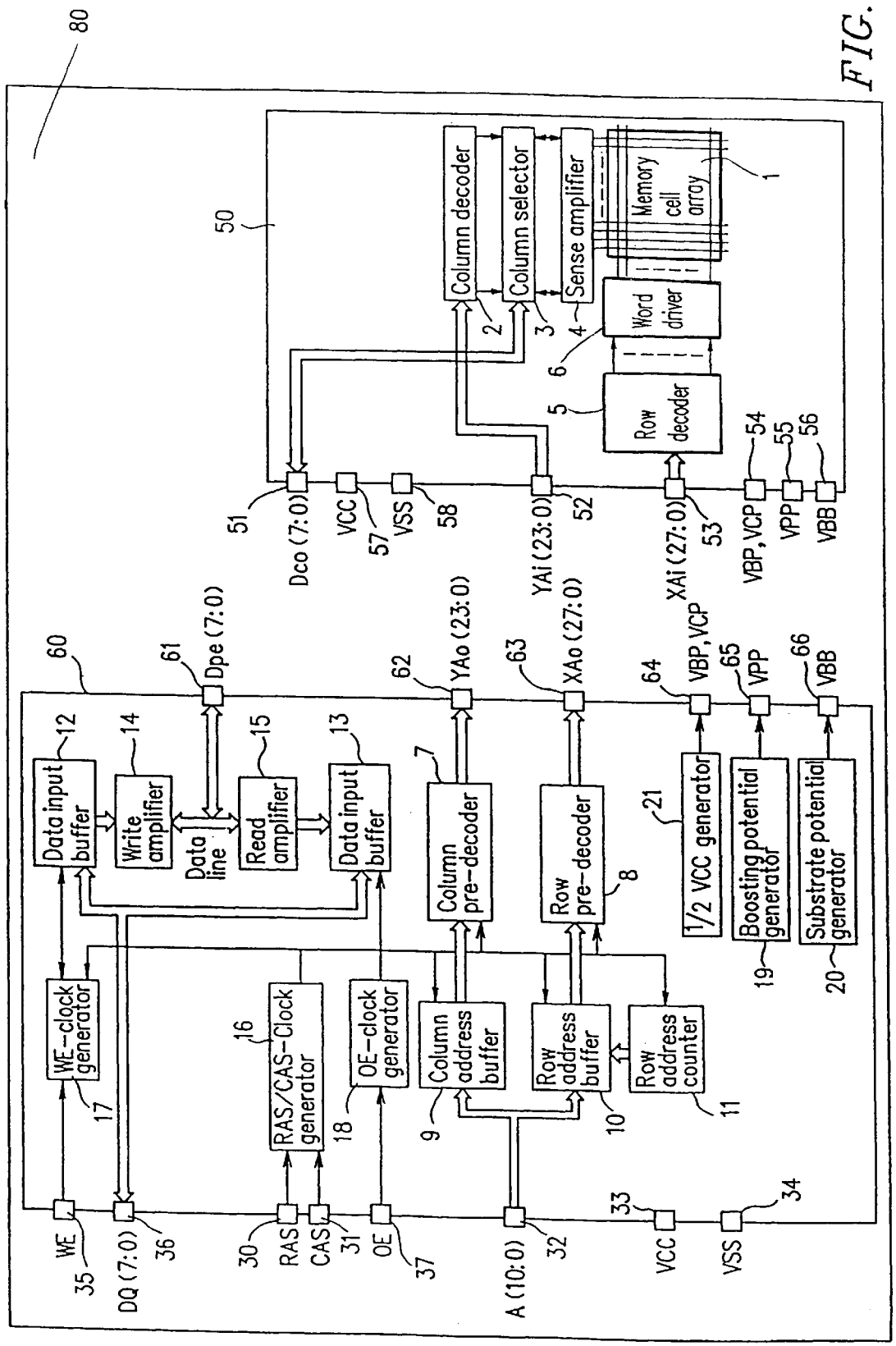
FIG. 9 is a block diagram showing an exemplary configuration for a semiconductor device according to a first example of the present invention.

FIG. 9 shows a configuration for a semiconductor device according to a first example of the present invention. In FIG. 9, the semiconductor device uses a configuration for a DRAM, and the same circuits as those shown in FIG. 1 are used and identified by the same reference numerals. In the DRAM 80, a memory core section 50 and a memory peripheral circuit section 60 are formed on two different semiconductor chips. The memory core section chip 50 includes: a memory cell array 1; and sense amplifiers 4, column selectors 3, column decoders 2, word drivers 6, and row decoders 5 which are laid out at the same pitch as the pitch for the memory cells inside the memory cell array 1. The signals input/output to/from the memory core section chip 50 include: a pre-decode address input signal XAi (27:0) input through an input terminal 53 to the row decoder 5; a pre-decode address input signal YAi(23:0) input through an input terminal 52 to the column decoder 2; a data input/output signal Dco(7:0) input/output through a terminal 51 to/from the column selector 3; a substrate potential input VBB input through a terminal 56; a boosting potential input VPP input through a terminal 55; a cell plate potential and bit line pre-charge potential input VBP, VCP input through a terminal 54; power supply inputs VCC and VSS input through terminals 57 and 58; and several control signal inputs (not shown).

The memory peripheral circuit section chip 60 includes: a row address buffer 10; a column address buffer 9; a row address counter 11; a row pre-decoder 8; a column pre-decoder 7; data input/output buffers 12 and 13; a write amplifier 14; a read amplifier 15; an RAS/CAS-clock generator 16; a WE-clock generator 17; an OE-clock generator 18; a boosting potential generator 19; a substrate potential generator 20; and a ½ generator 21. The signals input/output to/from the memory peripheral circuit section chip 60 include: an address input signal A(10:0), input through a terminal 32, functioning as an external signal to the DRAM 80; a data input/output signal DQ(7:0) input through a terminal 36; an RAS input signal input through a terminal 30; a CAS input signal input through a terminal 31; a WE input signal input through a terminal 35; an OE input signal input through a terminal 37; and power supply signals VCC and VSS input through terminals 33 and 34, respectively. The signals to be supplied to the memory core section chip 50 include: a pre-decode address output signal XAo(27:0) output from the row pre-decoder 8 through a terminal 63; a pre-decode address output signal YAo(23:0) output from the column pre-decoder 7 through a terminal 62; a data input/output signal Dpe(7:0) input/output through the data line via a terminal 61; a substrate potential generator output signal VBB output through a terminal 66; a boosting potential generator output signal VPP output through a terminal 65; a ½ VCC generator output signal VCP and VBP output through a terminal 64; and several control signal outputs (not shown).

By connecting the signals required to be provided between the memory core section chip 50 and the memory peripheral circuit section chip 60 with each other, it is possible to form a DRAM 80 functioning in the same manner as the DRAM 95 shown in FIG. 1.

Figure 2:
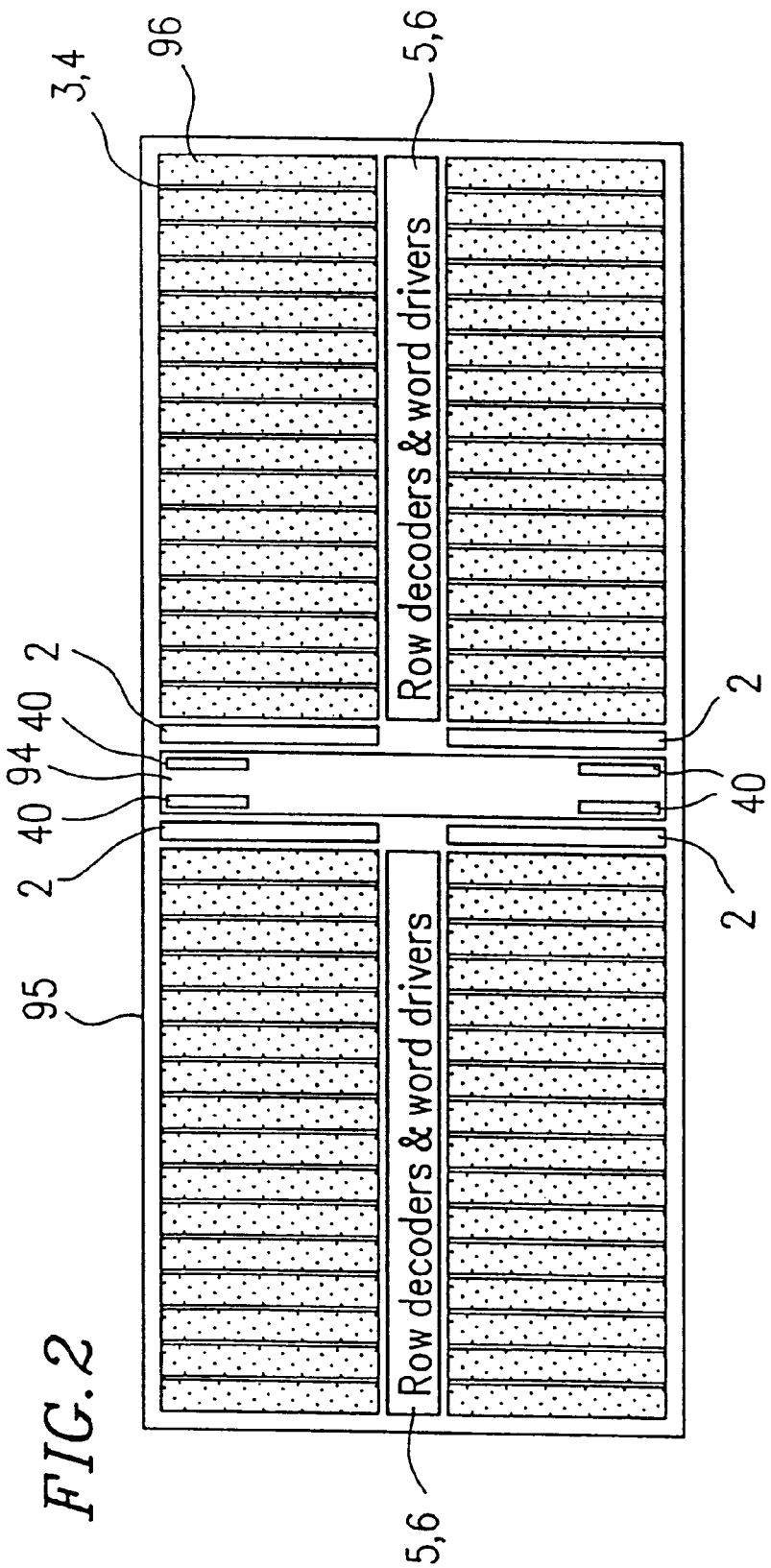
FIG. 2 is a plan view showing an exemplary layout for the DRAM shown in FIG. 1.
Figure 10:
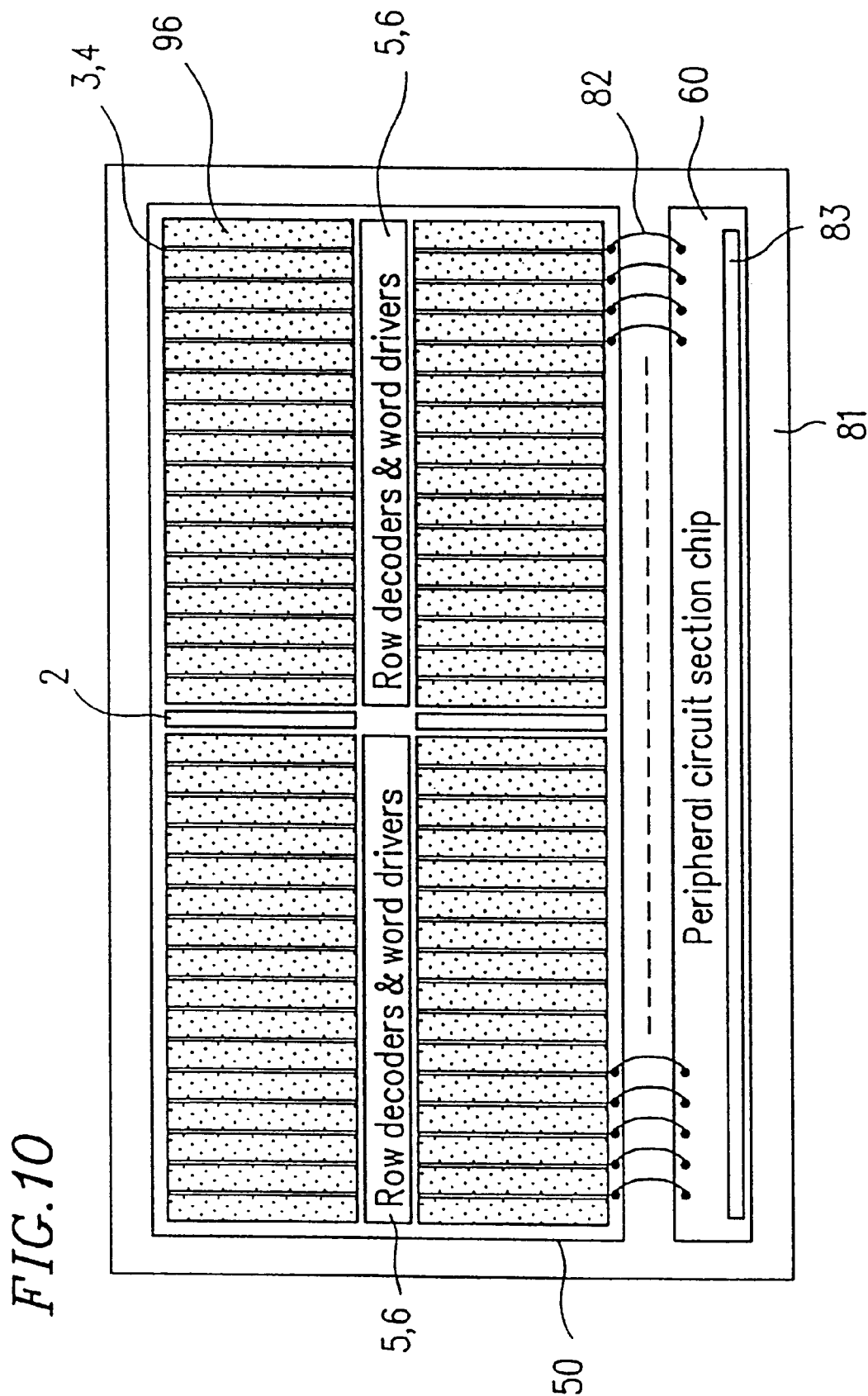
FIG. 10 is a plan view showing an exemplary layout for the semiconductor device shown in FIG. 9.

FIG. 10 shows an exemplary layout of the memory core section chip 50 of the DRAM 80 divided into the memory core section chip 50 and the memory peripheral circuit section chip 60 as shown in FIG. 9 and an exemplary configuration for the two mounted chips. The memory core section chip 50 is fabricated by performing the DRAM fabrication processes, and includes: a memory cell array 1; sense amplifiers 4; column selectors 3; row decoders 5; and word drivers 6. The four divided memory plates of the memory cell array 1, the row decoders 5 and the word drivers 6 are laid out in the same manner as in FIG. 2. However, one column decoder 2 is disposed in the center portion with respect to a pair of memory plates disposed on right and left sides, and the column selector select signal output from the column decoder 2 is commonly supplied to the column selectors inside the memory plates disposed on right and left sides.

On the memory peripheral circuit section chip 60, the respective circuits included in the memory peripheral circuit section 60 shown in FIG. 9 are disposed, and the memory peripheral circuit section chip 60 is fabricated by performing a fabrication process (such as a logic LSI fabrication process) different from the DRAM fabrication process used for the fabrication of the memory core section chip 50. By mounting the memory peripheral circuit section chip 60 and the memory core section chip 50 on a common substrate 81 and connecting these two chips with wire bond lines 82, the DRAM 80 shown in FIG. 9 is formed. A pad 83 for connecting the chip 60 with external pins is disposed on the memory peripheral circuit section chip 60, thereby mounting the DRAM having a configuration shown in FIG. 10 on a package used for mounting a conventional DRAM and connecting the pad in the pad formation portion 83 of the memory peripheral circuit section chip 60 with external pins.

In the case of using the 16 Mbit DRAM having a configuration shown in FIG. 9, the number of the connected signal lines between the memory peripheral circuit section chip 60 and the memory core section chip 50 becomes about 60. Therefore, such a connection is realized at a lower cost by using the wire bond lines 82 shown in FIG. 10. An inter-chip connection using a larger number of connected signal lines is easily realized by using a printed wiring board and mounting the chips on the board with a bump.

By forming the memory device in the above-described manner, it is possible to use an expensive memory fabrication process for the memory core section chip 50 only and an inexpensive logic LSI fabrication process for the memory peripheral circuit section chip 60, thereby fabricating an inexpensive DRAM.

In addition, only the potential of the semiconductor substrate for the memory core section chip 50 is set to be the substrate potential VBB in order to improve the performance of the DRAM, and the potential of the semiconductor substrate for the memory peripheral circuit section chip 60 can be set to be a ground potential like a logic LSI. Moreover, the circuits directly connected with the external pins of the package exist only on the memory peripheral circuit section chip 60. As a result, the latch up and electric surge resistance of the DRAM can be equalized with those of a logic LSI; the area of the protection circuit can be reduced; and the latch up and the electric surge can be easily processed in a DRAM fabricated by a fine patterning process.

In FIG. 10, the respective circuits shown in FIG. 9 are formed on the memory core section chip 50 and the memory peripheral circuit section chip 60. However, the circuit configurations of the memory core section chip 50 and the memory peripheral circuit section chip 60 depend upon the method for dividing a memory device into blocks and the number of the lines between the chips. An optimal layout of the circuit elements on the memory core section chip 50 and the memory peripheral circuit section chip 60 depends upon the required specifications of the memory device to be fabricated.

In the foregoing description, an embodiment of an inexpensive DRAM according to the present invention where the memory core section chip 50 and the memory peripheral circuit section chip 60 are fabricated by performing different semiconductor fabrication processes has been described. However, as will be appreciated easily, by applying the exemplary memory configurations as shown in FIGS. 9 and 10 to semiconductor memory devices other than the DRAM, e.g., an SRAM, an EEPROM, a flash memory and the like, the same effects can be attained.

EXAMPLE 2

Figure 11:
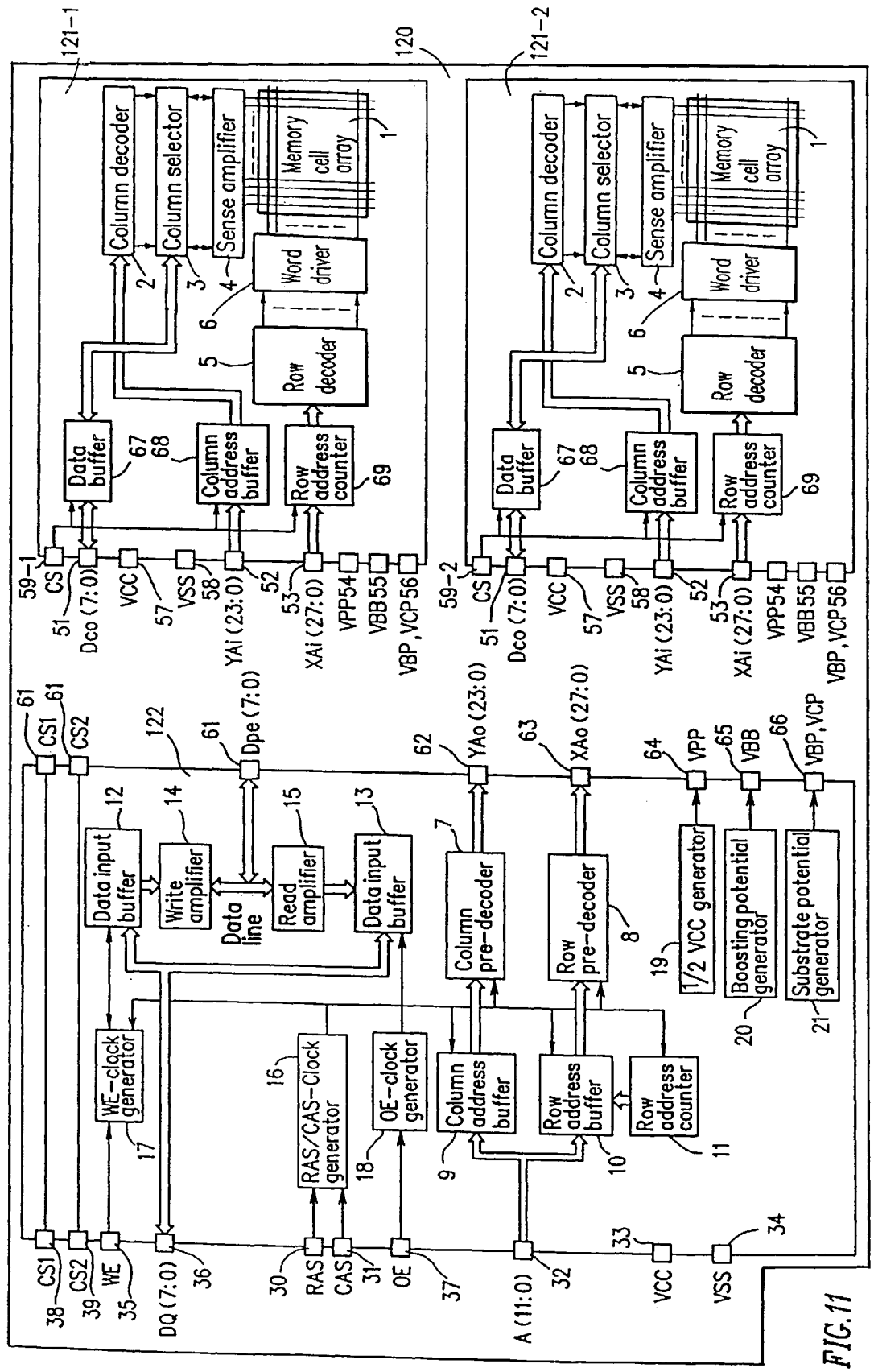
FIG. 11 is a block diagram showing an exemplary configuration for a semiconductor device according to a second example of the present invention.
Figure 12:
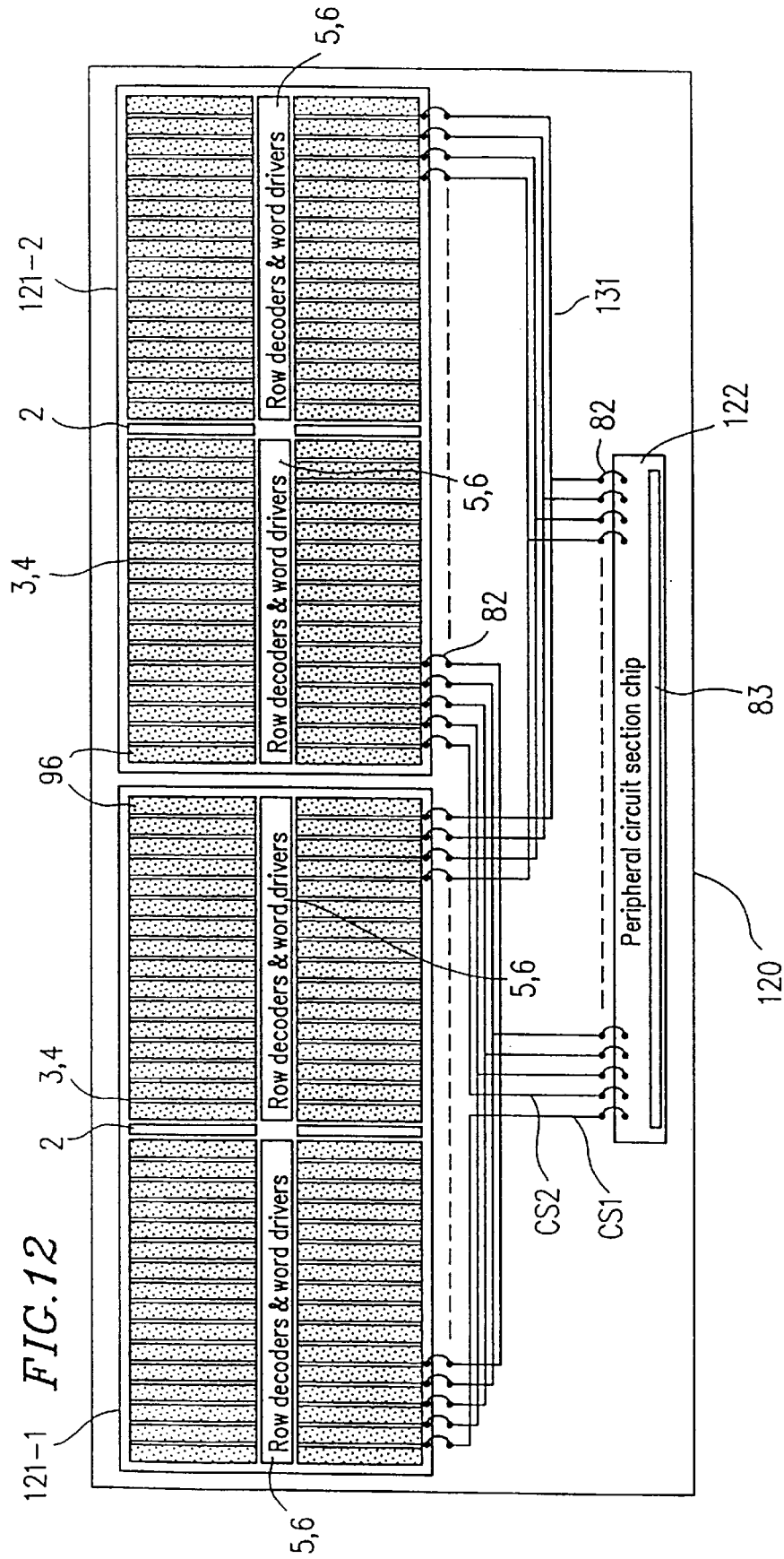
FIG. 12 is a plan view showing an exemplary layout for the semiconductor memory device shown in FIG. 11.

In FIGS. 9 and 10, an embodiment of the memory device having only one memory core section is shown. However, if a memory device having a capacity required for a system cannot be formed by using one chip, then it is necessary to use a plurality of chips for forming the system. FIG. 11 shows a configuration for a semiconductor device according to a second example of the present invention. In FIG. 11, a plurality of memory core sections (two memory core section chips in this example) are provided and the memory core sections and the memory peripheral circuit section are formed on different chips. The memory core section chips 121-1 and 121-2 include the same circuit elements as those provided for the memory core section chip 50 shown in FIG. 9. The buffers 67 to 69 are provided for the signals input/output to/from the memory core section chips 121-1 and 121-2, and the respective signals are controlled so as to be activated by chip select signals CS input/output to/from terminals 59-1 and 59-2, respectively. The peripheral circuit section chip 122 has the same configuration as that of the peripheral circuit section chip 60 shown in FIG. 9 except that two chip select signals CS1 and CS2 input/output through terminals 38 and 39, respectively, cross the chip. FIG. 12 shows an exemplary layout for the semiconductor device where the memory core section chips 121-1 and 121-2 and the peripheral circuit section chip 122 are mounted on a substrate 120 and the respective chips are connected with each other. As shown in FIG. 12, the respective signal pads are connected via a wire bond 82 with the substrate 120; the signal lines of the memory core section chips 121-1 and 121-2 are commonly connected with each other via the lines 131 on the substrate 120 except for the chip select signals CS, and connected with the peripheral circuit section chip 122. The respective chip select signals CS of the memory core section chips 121-1 and 121-2 are independently connected with the two chip select signals CS1 and CS2 input/output through the terminals 38 and 39, respectively, of the peripheral circuit section chip 122.

In the case of externally accessing the memory core section chip 121-1, necessary signals are supplied to the RAS signal input terminal 30; the CAS signal input terminal 31; the WE signal input terminal 35; and the OE signal input terminal 37, and a select signal is supplied to the CS1 input terminal 38, thereby activating the signal line buffers 67 to 69 of the memory core section chip 121-1, supplying the necessary signals to the memory core, and performing the access. In this case, since the select signal is not supplied to the CS2 input terminal 39, the signal line buffers 67 to 69 of the memory core section chip 121-2 are not activated, and the access to the memory core section is not performed. Therefore, by generating the chip select signals CS1 and CS2 by one bit of an address for the memory and supplying the remaining addresses to an address terminal 32, the access to the entire memory space formed by the memory core section chips 121-1 and 121-2 can be performed.

In FIGS. 11 and 12, two memory core section chips are used. However, as will be readily appreciated, even when a larger number of memory core section chips are used, by supplying to the memory peripheral circuit the same number of chip select signals as the number of the memory core section chips, the same function is realized.

By using the configurations shown in FIGS. 11 and 12, the memory peripheral circuit can be commonly used among a plurality of memory core section chips.

EXAMPLE 3

As described above, it is possible to fabricate an inexpensive semiconductor memory device by dividing a semiconductor memory device into the memory core section chip and the memory peripheral circuit section chip and connecting both chips using some mounting member.

However, such a memory device, together with another LSI such as a signal processing LSI, constitute a system. Hereinafter, a method for realizing an optimal semiconductor device including such a memory device and a signal processing LSI will be described at a systematic level.

In order to form a signal processing system, it is preferable to use integrated signal processing chips and semiconductor memory chips. Accordingly, a signal processing system is formed by combining a plurality of signal processing chips and a plurality of memory chips.

On the other hand, MCM bare chip mounting technologies have been developed for downsizing a system such as a portable equipment. According to the MCM bare chip mounting technologies, a bare LSI chip is mounted on a substrate and the respective LSI chips are connected with each other by utilizing various methods.

Figure 13:
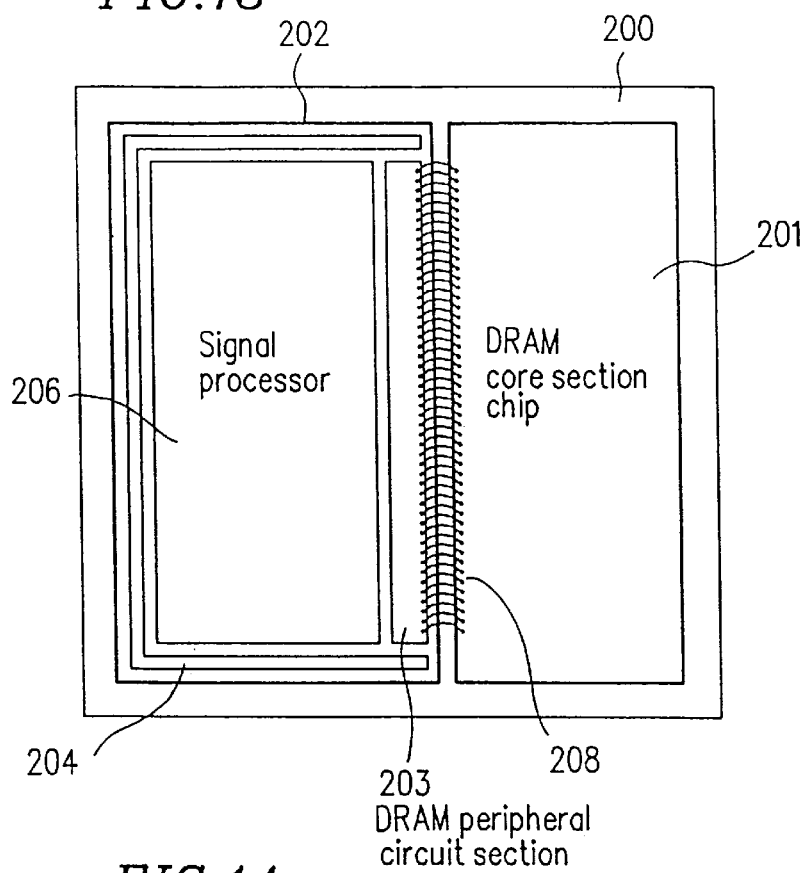
FIG. 13 is a plan view showing an exemplary configuration for a semiconductor device according to a third example of the present invention.

FIG. 13 shows an exemplary configuration for a semiconductor device using a semiconductor memory chip and a signal processing chip according to a third example of the present invention. In FIG. 13, a DRAM is used as the semiconductor memory chip. As shown in FIG. 13, a DRAM core section chip 201 and a signal processing chip 202 are mounted on a circuit board 200. The DRAM core section chip 201 has the same circuit configuration as that of the memory core section chip 50 shown in FIG. 9 and is fabricated by performing a memory fabrication process. The signal processing chip 202 includes: a signal processor 206 for performing a logic operation and the like; a DRAM peripheral circuit section 203; and a pad formation section 204 for connecting the pad with external pins. In the signal processing chip 202, the signal processor 206 can perform a logic operation and the DRAM peripheral circuit section 203 has the same circuit configuration as that of the memory peripheral circuit section 60 shown in FIG. 9. Accordingly, the signal processing chip 202 can be fabricated by performing logic LSI fabrication processes. The DRAM peripheral circuit section 203 and the DRAM core section chip 201 are connected with wire bond lines 208. In this case, if the memory capacity of 2 Mbytes is required for the system, then the memory capacity of the DRAM core section chip 201 becomes 16 Mbits. Therefore, such a system can be fabricated by using one chip according to the current semiconductor fabrication technologies. In the case of transmitting the data at a bit width of eight bits between the signal processor 206 and the memory, the number of the signal lines connected between the DRAM peripheral circuit section 203 and the DRAM core section chip 201 becomes about seventy as described above referring to FIG. 10. Therefore, the DRAM peripheral circuit section 203 and the DRAM core section chip 201 can be connected by a wire bonding method as shown in FIG. 13.

In such a configuration, when the signal processor 206 in the signal processing chip 202 accesses the DRAM, the signal processor 206 inputs and outputs the data by supplying addresses and control signals to the DRAM peripheral circuit section 203 provided in the same chip.

By using such a configuration, only the memory core section of the DRAM core section chip 201 laid out at the pitch of the memory cells is fabricated by performing the expensive memory fabrication processes, and the DRAM peripheral circuit section 203 together with the signal processor 206 can be fabricated by performing inexpensive semiconductor fabrication processes. In the case where a large scale signal processor 206 is formed in the signal processing chip 202, the increase in the size of the signal processing chip 202 can be considerably reduced as compared with the case where the DRAM peripheral circuit section 203 is not provided. Therefore, even when the DRAM peripheral circuit section 203 is provided, the decrease in the production yield and the increase in the cost necessary for fabricating the chip are very small, and an inexpensive system can be fabricated.

As described above, according the MCM technologies, the signal processing chip and the memory chip can be connected with each other via a large number of lines. Therefore, a high-performance signal processing system is realized at a lower cost by utilizing the MCM technologies.

EXAMPLE 4

Figure 14:
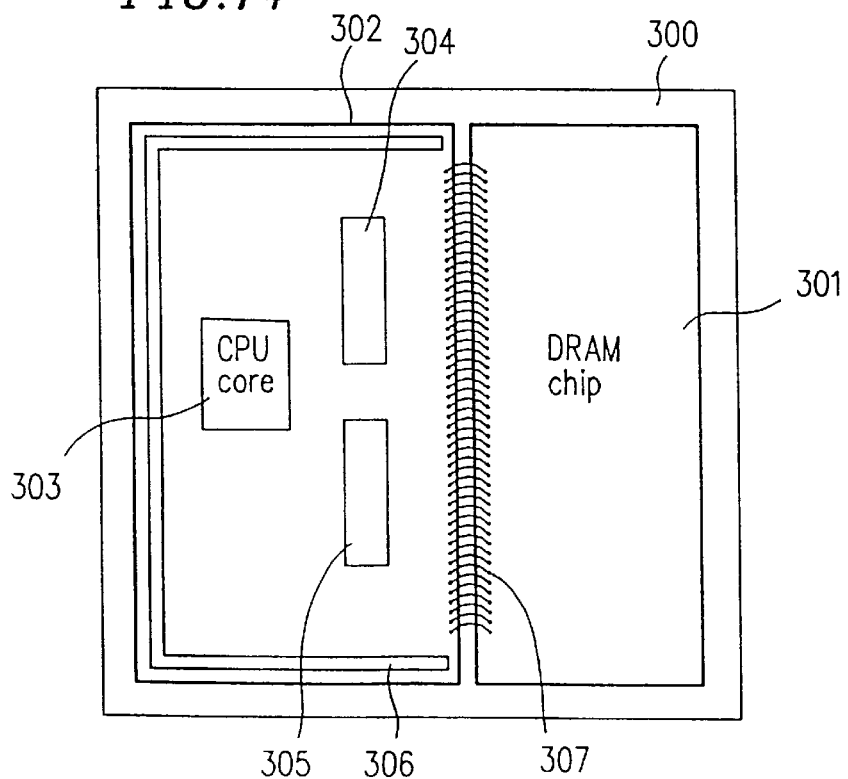
FIG. 14 is a plan view showing an exemplary configuration for a semiconductor device according to a fourth example of the present invention.

FIG. 14 shows a configuration for a semiconductor device according to a fourth example of the present invention. In FIG. 14, the semiconductor device includes a signal processing system consisting of a semiconductor memory chip and a signal processing chip fabricated by the MCM technologies. In this example, a DRAM is used as the semiconductor memory chip. The signal processing chip 302 includes: a CPU core 303 for performing an operation; a data cash memory 304 and an instruction memory 305 for realizing a fast access to the memory. In the case where the access from the CPU core 303 to the data cash memory 304 and the instruction memory 305 is a mishit, a large amount of data is required to be transmitted between the DRAM chip 301 and the data cash memory 304 and between the DRAM chip 301 and the instruction memory 305 in order to substitute the data of the DRAM chip 301 for the block data inside the data cash memory 304 and the instruction memory 305. Since the time required for transmitting the data affects the processing performance of the system, the data is required to be transmitted in a short period of time.

In this case, if the memory capacity of 2 Mbytes is required for the system, then the memory capacity of the DRAM chip 301 becomes 16 Mbits. Therefore, such a system can be fabricated by using one chip according to the current semiconductor fabrication technologies. In a conventional 16 Mbit DRAM, the bit width for inputting/outputting the data is in an approximate range of 8 to 16 bits in consideration of the increase in the power consumption and noise caused by the load capacitance drive, as described above. On the other hand, the capacitance of the data pin terminals of the packaged DRAM shown in FIG. 3 becomes about 5 pF as described above, and the capacitance of the data pin terminals of the signal processing LSI is substantially the same as that of the DRAM. Consequently, the capacitance of the data lines connected with the signal processing LSI and the DRAM in mounting the signal processing LSI and the DRAM on a printed wiring board shown in FIG. 3 becomes equal to the total of the respective terminal capacitances and the capacitance of the printed wiring board, e.g., approximately 15 pF. On the other hand, in the configuration shown in FIG. 14, the respective chips are supposed to be fabricated by utilizing the MCM mounting technologies. Accordingly, since the external load capacitance of the data pins for the signal processing LSI and the DRAM is limited, a transistor size of the input/output buffers is not required to be increased. In addition, since the data pins are not directly connected with the external pins, it is not necessary to provide an electric surge protection device, the terminal capacitance of the data pins can be set to be about 1 pF. Therefore, since the capacitance of the data lines connected with the signal processing LSI and the DRAM becomes about 2 pF, the power consumption required for driving the data pin capacitance becomes equal to the power consumption required for the mounting shown in FIG. 3, even when the number of the data pins is in a range of 60 to 120 bits.

Therefore, by using the system configuration shown in FIG. 14, a plurality of data terminals can be provided for the signal processing chip 302 and the DRAM chip 301 in order to transmit the data between the signal processing chip 302 and the DRAM chip 301 at a higher rate. As a result, a plurality of data can be simultaneously transmitted between these chips. In addition, even when the access from the CPU core 303 to the data cash memory 304 and the instruction memory 305 is a mishit, the rate for transmitting the data can be set to be high between the signal processing chip 302 and the DRAM chip 301, thereby realizing a high-performance system.

As described above, when an LSI is fabricated in the system configuration shown in FIG. 14 by utilizing the MCM technologies, the signal processing chip and the memory chip can be connected with each other via a large number of lines. Therefore, by providing a plurality of data terminals for the signal processing chip 302 and the DRAM chip 301, respectively, a plurality of data can be simultaneously transmitted, so that a high speed data transmission is realized.

EXAMPLE 5

Hereinafter, a semiconductor device having a system configuration according to a fifth example of the present invention will be described. The semiconductor device of the fifth example can simultaneously transmit a plurality of data by utilizing MCM technologies, thereby realizing a low-voltage operation of the device at a low power consumption.

Figure 15:
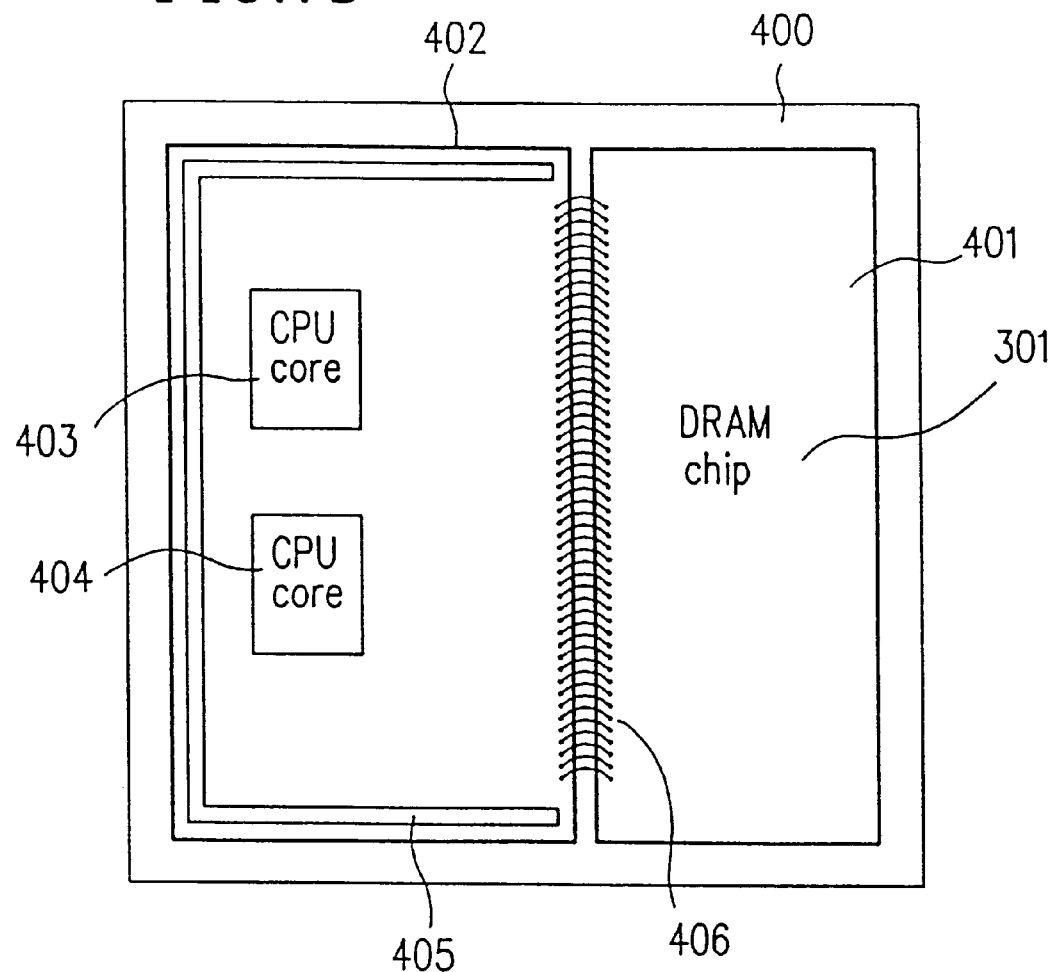
FIG. 15 is a plan view showing an exemplary configuration for a semiconductor device according to a fifth example of the present invention.

FIG. 15 shows a configuration for the semiconductor device according to the fifth example of the present invention. The semiconductor device has a system configuration allowing for the transmission of a plurality of data between a semiconductor memory and a signal processing LSI, and a parallel processing of the data in the signal processing LSI. In this example, a DRAM is used as the semiconductor memory. The signal processing chip 402 includes two CPU cores 403 and 404 for performing a parallel processing. Both the DRAM chip 401 and the signal processing chip 402 include a plurality of data terminals in order to transmit the data through the data terminals between the DRAM chip 401 and the signal processing chip 402. The DRAM chip 401 and the signal processing chip 402 are connected with each other via a large number of wire bond lines 406.

In the case where the signal is processed by the signal processing system having an architecture of 8 bits including the CPU cores 403 and 404 for performing an 8 bit processing, two data can be simultaneously processed by the CPU cores 403 and 404 if the data is transmitted at 16 bits between the DRAM chip 401 and the signal processing chip 402. Therefore, the signal processing system shown in FIG. 15 can double the amount of the data to be processed as compared with the system shown in FIG. 3 where the data is transmitted at 8 bits between the signal processing LSI and the DRAM, and the signal processing LSI processes the data at 8 bits.

Figure 3:
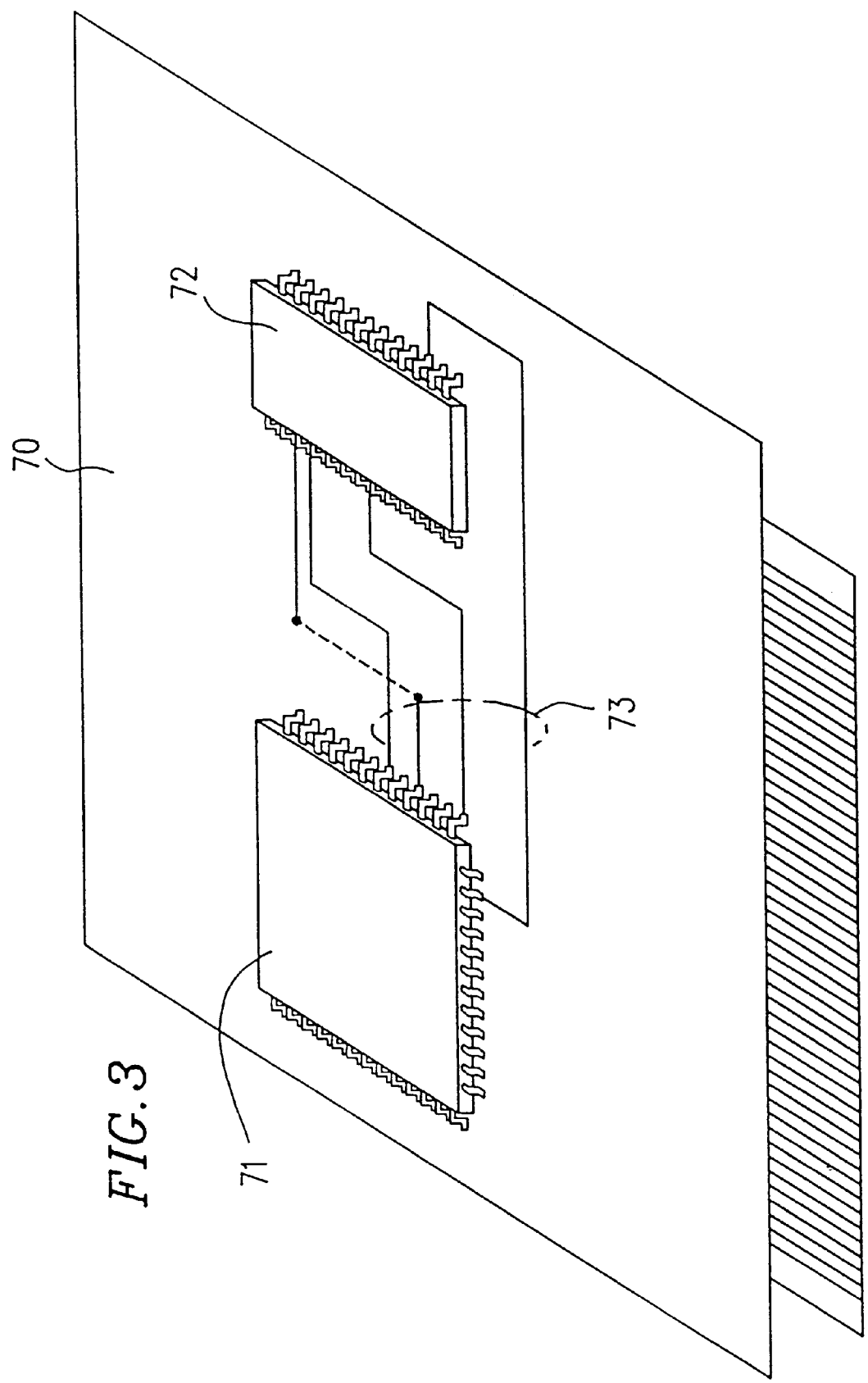
FIG. 3 is a perspective view showing an exemplary configuration for a conventional system using a semiconductor memory device.
Figure 16A:
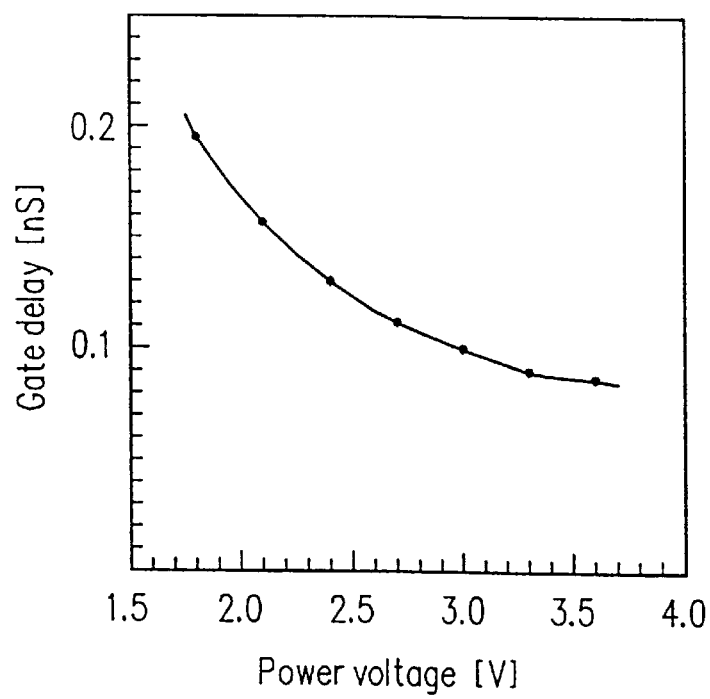
Figure 16B:
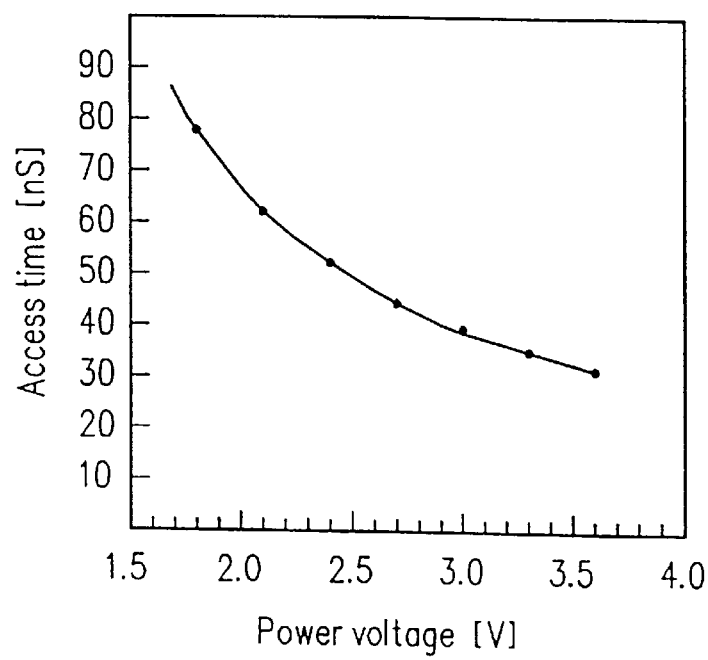
FIG. 16B is a graph showing a power voltage dependence of a DRAM access time.

In addition, in the case where the same amount of data as that of the data processed by the system shown in FIG. 3 is processed by the system shown in FIG. 15, the power consumption can be considerably reduced. FIG. 16A is a graph showing a power voltage dependence of the gate delay at the logic gates used in the signal processing chip 402, while FIG. 16B is a graph showing a power voltage dependence of an access time in the DRAM chip 401. The amount of the delay is doubled at the voltage of about 1.9 V both in the logic gate (FIG. 16A) and the DRAM (FIG. 16B) with respect to the delay at the power voltage of 3.3 V conventionally used. Therefore, by using the system shown in FIG. 15 where a two-word data transmission is performed between the DRAM chip 401 and the signal processing chip 402 and the signal is processed in parallel by the two CPU cores 403 and 404 of the signal processing chip 402, the same amount of data as that of the data processed at the power voltage of 3.3 V by the system shown in FIG. 3 can be processed at the power voltage of 1.9 V.

FIG. 17 is a table for comparing conventional systems and the system shown in FIG. 15 of the semiconductor device according to the fifth example of the present invention. In FIG. 17, a discrete system (System 1) is a system where the packaged memory and signal processing LSI are mounted on a printed wiring board as shown in FIG. 3; a widely used chip (MCM; System 2) is a system obtained by mounting a conventional memory chip and signal processing chip utilizing the MCM technologies; and System 3 is a system shown in FIG. 15 of the semiconductor device according to the fifth example of the present invention. The principal feature of System 3 lies in that a plurality of data is simultaneously transmitted and processed in parallel between the signal processing chip and the memory chip. Systems 1 and 2 operate at a clock of 20 MHz, while System 3 operates at a clock of 10 MHz. However, since a parallel processing is performed in System 3, the same performance as those of Systems 1 and 2 is realized by System 3. Therefore, a power voltage of 3.3 V is required for operating Systems 1 and 2, whereas the power voltage required for operating System 3 is 1.9 V. When a power consumption of about 1 W is required for operating Systems 1 and 2, the power consumption required for operating System 3 is only about 250 mW. Consequently, System 3 realizes the same performance by consuming a power one fourth as small as the power required for operating Systems 1 and 2.

As described above, by transmitting a plurality of data and processing the data in parallel utilizing the MCM technologies according to the present invention, a system operating at a low voltage and a low power consumption is realized.

EXAMPLE 6

FIG. 18 shows a semiconductor device according to a sixth example of the present invention for realizing a system where a plurality of data is transmitted and processed in parallel by utilizing MCM technologies at a lower cost. FIG. 18 shows an exemplary configuration for a portable information terminal device or the like including a DRAM chip, a flash memory chip and a signal processing chip formed by utilizing the MCM technologies. As shown in FIG. 18, the signal processing chip 102, the DRAM core section chip 101, and the flash memory core section chip 103 are mounted on a common substrate 100. The signal processing chip 102 includes: two CPU c ores 107 and 108 for performing a parallel processing; a DRAM peripheral circuit section 104; and a flash memory peripheral circuit section 105. Furthermore, in order to transmit a plurality of data among the signal processing chip 102, the DRAM core section chip 101, and the flash memory core section chip 103, a plurality of data terminals are provided for the DRAM core section chip 101, the flash memory core section chip 103, and the DRAM peripheral circuit section 104 and the flash memory peripheral circuit section 105 inside the signal processing chip 102. The signal processing chip 102, the DRAM core section chip 101, and the flash memory core section chip 103 are connected with each other via a large number of wire bond lines 110 and 111.

In such a system configuration, a system operating at a low voltage and a low power consumption is realized by transmitting a plurality of data and processing the data in parallel utilizing the MCM technologies as described with reference to FIGS. 15 to 17. In addition, in the same way as the system shown in FIG. 13, only the memory core section laid out at the pitch for the memory cells is required to be fabricated by utilizing expensive semiconductor fabrication processes in the DRAM core section chip 101 and the flash memory core section chip 103. The DRAM peripheral circuit section 104 and the flash memory peripheral circuit section 105 can be formed on one and the same chip where the signal processor 106 and the CPU cores 107 and 108 are mounted by performing the semiconductor fabrication processes such as a logic LSI process at a lower cost as compared with the memory process. Therefore, it is possible to realize an inexpensive system operating at a low voltage and a low power consumption.

Figure 19A:
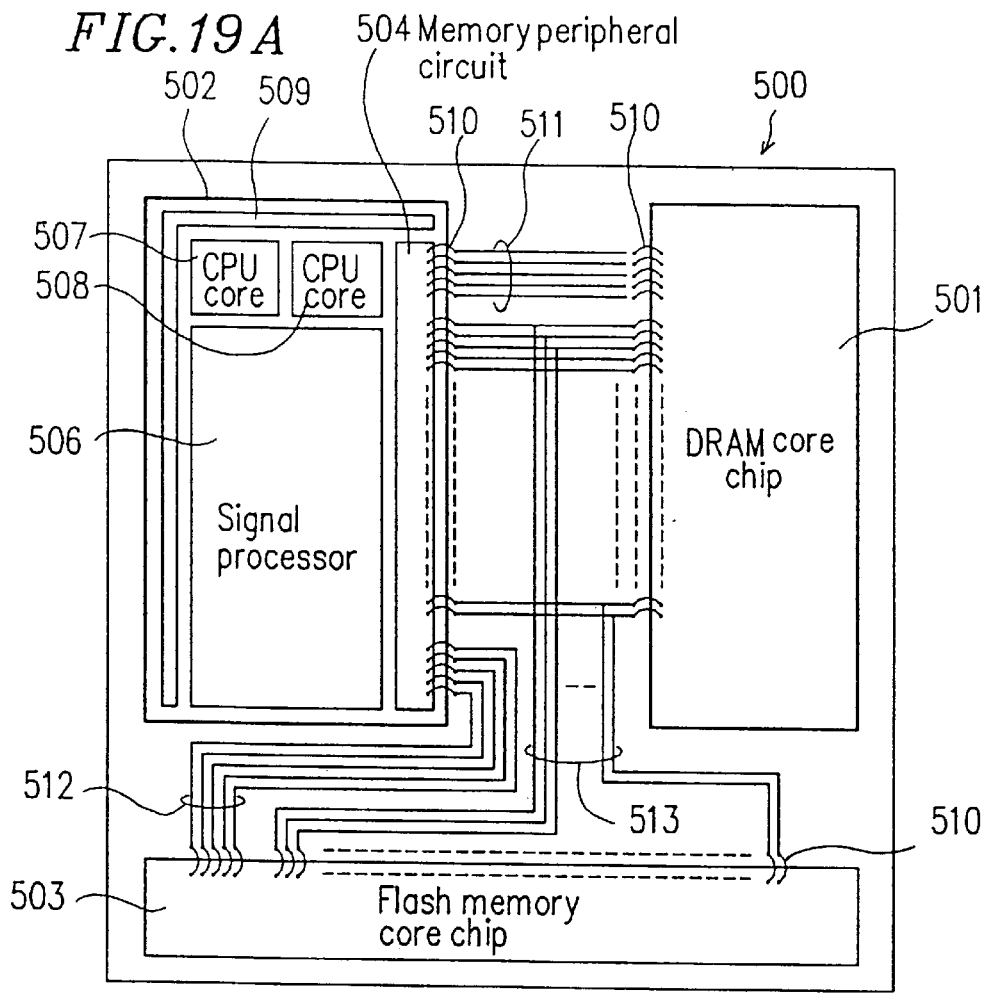
FIGS. 19A and 19B show another exemplary configuration for the semiconductor device according to the sixth example of the present invention.

As already described with reference to FIGS. 11 and 12, in the case of using a plurality of memory core section chips having the same configuration, the memory peripheral circuit can be commonly used. In the same way, by using one and the same word configuration for the DRAM core section chip 101 and the flash memory core section chip 103 in the semiconductor device shown in FIG. 18 fabricated by utilizing the MCM technologies, the memory peripheral circuit can be commonly used between the DRAM core section chip and the flash memory core section chip as shown in FIG. 19A. As shown in FIG. 19A, the semiconductor device includes: a DRAM core section chip 501; a flash memory core section chip 503; and a signal processing chip 502. The signal processing chip 502 includes: a signal processor 506; CPU cores 507 and 508; and a memory peripheral circuit 504.

Figure 19B:
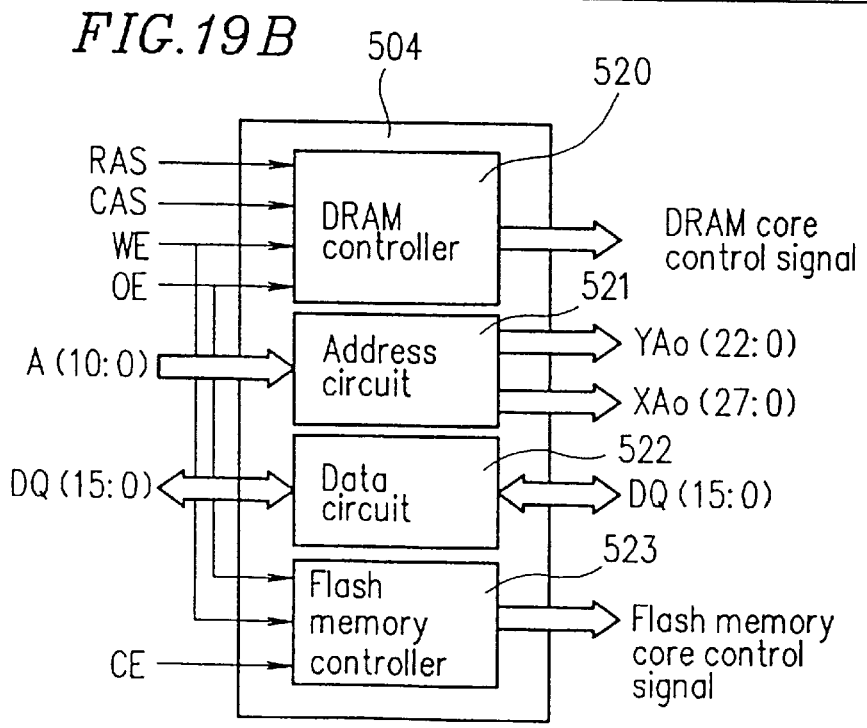

FIG. 19B shows a detailed configuration for the memory peripheral circuit 504. Since the DRAM core section chip 501 and the flash memory core section chip 503 are controlled in different manners, the memory peripheral circuit 504 includes a DRAM controller 520 and a flash memory controller 523. The DRAM controller 520 is controlled based on a RAS signal and a CAS signal and the flash memory controller 523 is controlled based on a chip enable (CE) signal. An address circuit 521 including: the column address buffer 9; the row address buffer 10; the row address counter 11; the column pre-decoder 7; and the row pre-decoder 8 shown in FIG. 9, and a data circuit 522 including: the data input buffer 12; the data output buffer 13; the write amplifier 14; and the read amplifier 15 also shown in FIG. 9 are commonly used by the DRAM core section chip 501 and the flash memory core section chip 503.

The DRAM core section chip 501, the signal processing chip 502 and the flash memory core section chip 503 are mounted on the substrate 500, the signal terminals for connecting the respective chips with each other are bonded with the substrate 500 by the wire bond 510, and the respective chips are connected with each other through the lines 511 to 513 on the substrate 500. Through the signal terminals of the memory peripheral circuit 504, a DRAM core control signal is connected with the DRAM core section chip 501 through the lines 511, a flash memory control signal is connected with the flash memory core section chip 503 through the lines 512, and signals for the address and data circuits are connected with the DRAM core section chip 501 and the flash memory core section chip 503 through the lines 513.

In the case where the signal processing chip 502 reads out the data from the DRAM core section chip 501, the RAS, CAS and OE signals are generated by the signal processor 506, and then supplied to the memory peripheral circuit 504 together with the addresses. In the memory peripheral circuit 504, the DRAM controller 520 generates a DRAM core control signal based on the RAS, CAS and OE signals, and the address circuit 521 generates a pre-decode address and supplies the address to the DRAM core section chip 501, thereby reading out the data from the DRAM core and outputting the data to the signal processor 506 via the data circuit 522. In this case, since CE is not supplied to the flash memory controller 523, the flash memory control signal is not generated and the flash memory core section chip 503 remains in the waiting state. In the case where the signal processing chip 502 reads out the data from the flash memory core section chip 503, the CE and OE signals are generated by the signal processor 506 and then supplied to the memory peripheral circuit 504 together with the addresses. In the memory peripheral circuit 504, the flash memory controller 523 generates a flash memory core control signal based on the CE and OE signals, and the address circuit 521 generates a pre-decode address and supplies the address to the flash memory core section chip 503, thereby reading out the data from the flash memory core and outputting the data to the signal processor 506 via the data circuit 522. In this case, since RAS and CAS are not supplied to the DRAM controller 520, the DRAM control signal is not generated and the DRAM core section chip 501 remains in the waiting state. In writing the data from the signal processing chip 502 to the DRAM core section chip 501 or the flash memory core section chip 503, the data can be written onto either one of the DRAM core section chip 501 and the flash memory core section chip 503, by supplying either the RAS and CAS signals or the CE signal to the memory peripheral circuit 504.

In the semiconductor device shown in FIGS. 19A and 19B, the same word configuration is used for the memory core section of the DRAM core section chip 501 and the flash memory core section chip 503. However, even when different word configurations are used for the two chips, a part of the column address buffer, the row address buffer, the column pre-decoder, and the row pre-decoder in the address circuit 521 and a part of the data input buffer, the data output buffer, the read amplifier and the write amplifier in the data circuit 522 can be commonly used, as will be easily understood.

As described above, even when a plurality of memories of different kinds are used, a part of a memory peripheral circuit can be commonly used by forming a memory core section and a memory peripheral circuit section on different chips.

In the foregoing examples, the present invention has been described as being applied to a DRAM. However, as described at first, the present invention is not limited to a DRAM. The embodiments where the present invention is applied to the DRAM have been described in detail. This is because, if a principal aspect of the present invention where a memory core section and a memory peripheral circuit section of a DRAM are formed on different semiconductor chips is described in detail, then it is possible to most suitably illustrate one of the main features of the present invention and indicate the problems of the conventional idea that the memory core section and the memory peripheral circuit section of the DRAM should be formed on one and the same semiconductor chip. In addition, the present invention is not limited to an MCM.

EXAMPLE 7

Hereinafter, a method for grouping the circuit blocks into the groups to be formed on different semiconductor chips will be described with reference to the drawings.

Figure 20A:
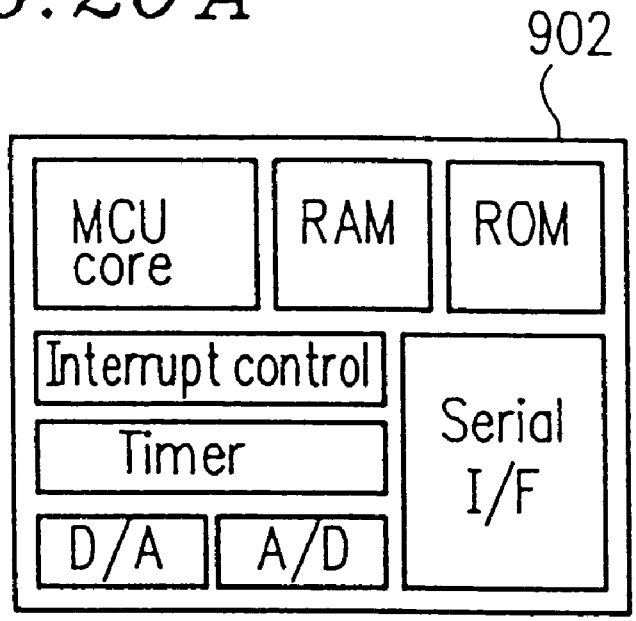
Figure 20B:
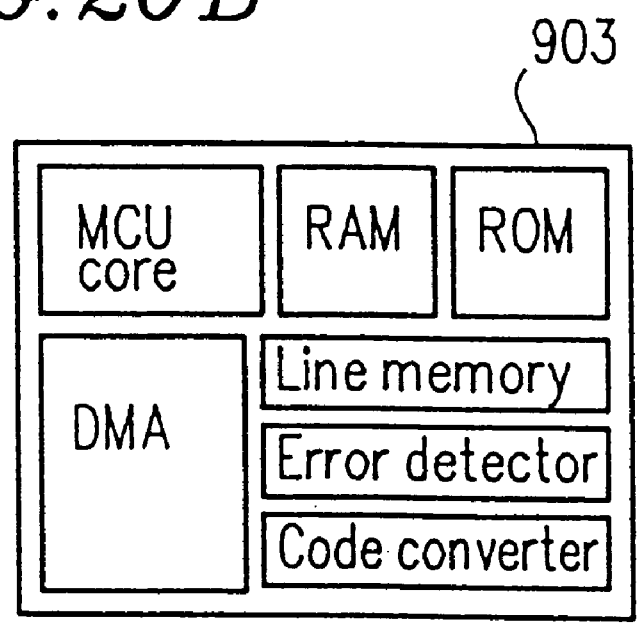
FIG. 20B is a block diagram schematically showing a configuration for a video processing MCU.

FIG. 20A is a block diagram showing a configuration for a generally used controller MCU 902, while FIG. 20B is a block diagram showing a configuration for a generally used video processing MCU 903.

First, the circuit information of the controller MCU 902 and the block parameters representing the features of the respective circuit blocks are extracted and read into a CAD system. Next, the hierarchies of the respective blocks are classified until the blocks can be grouped. For example, an LSI-0 is classified into the following circuit blocks: an MCU core; a serial I/F; a ROM; a RAM; a timer; an interrupt control; a D/A; and an A/D.

Next, based on a parameter of whether each circuit block is an "MCU core" or a "peripheral circuit", the hierarchically classified circuit blocks are grouped.

In this example, the circuit blocks in the MCU core are selected as a group of LSI-1, and the circuit blocks in the serial I/F, the ROM, the RAM, the timer, the interrupt control, the D/A and the A/D are selected as groups of LSI-2, so that hierarchies LSI-1 and LSI-2 are produced.

By performing the same procedure, hierarchies LSI-1 and LSI-2 can be produced with respect to the video processing MCU.

Figure 21A:
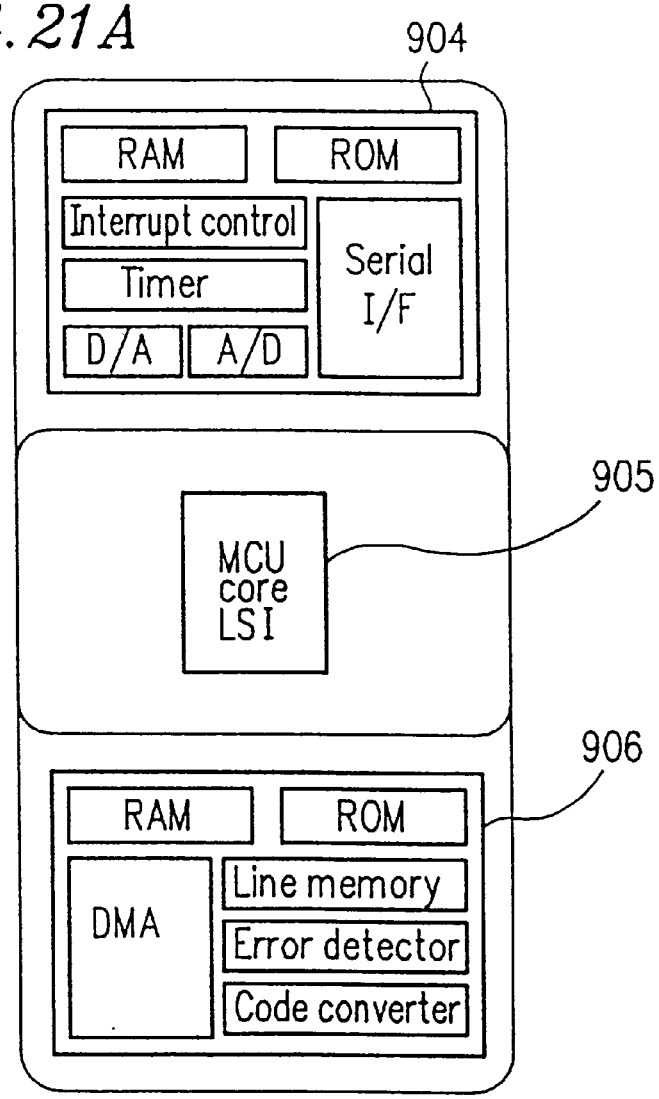
Figure 21B:
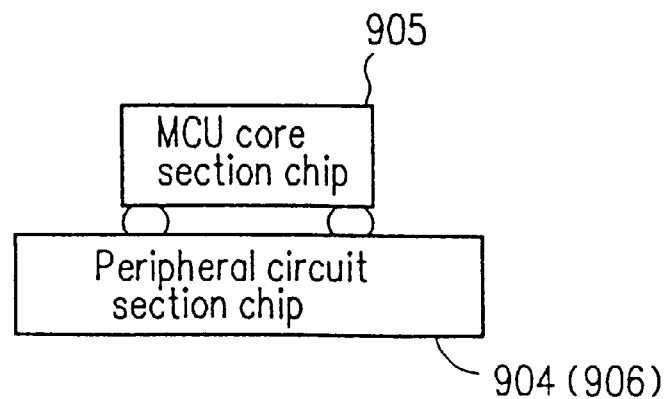
FIG. 21B is a cross-sectional view schematically showing a connection of the two semiconductor chips where the grouped circuit blocks are formed.

FIG. 21A schematically shows a state where an MCU core 905 and peripheral circuits 904 are separated from the controller MCU 902 and the video processing MCU 903. FIG. 21B schematically shows the cross section of a semiconductor device in which the MCU core section chip 905 and the peripheral circuit section chip 904 or 906 are connected with each other by utilizing MCM technologies.

Figure 22A:
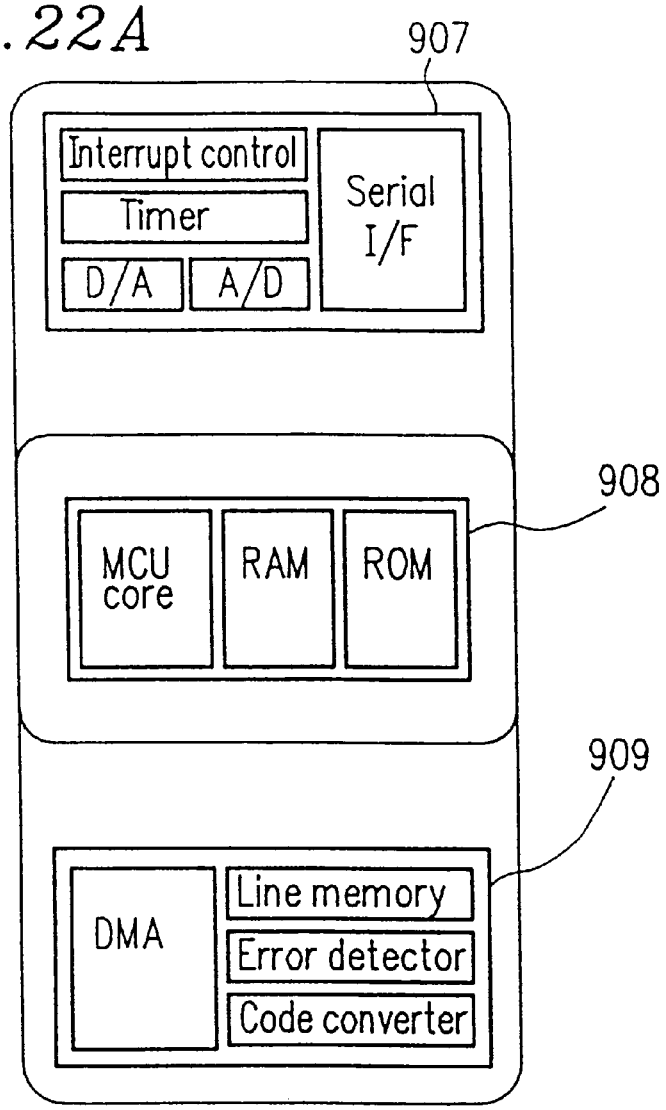
Figure 22B:
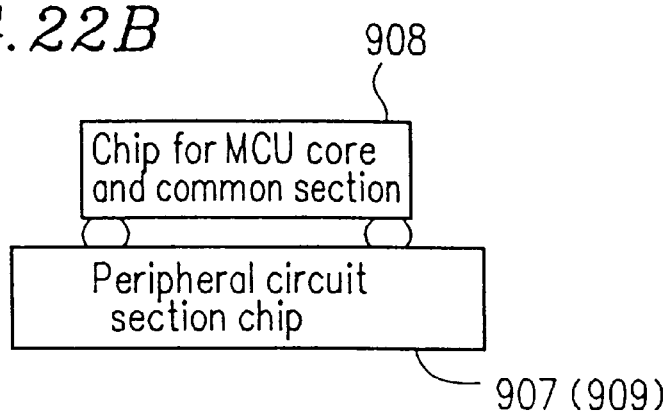
FIG. 22B is a cross-sectional view schematically showing a connection of the two semiconductor chips where the grouped circuit blocks are formed.

FIG. 22A shows a case where the MCM core, the ROM and the RAM are selected as the circuit blocks belonging to the group LSI-1 and the serial I/F, the timer, the interrupt control, the D/A and the A/D are selected as the circuit blocks belonging to the group LSI-2 in grouping the respective circuit blocks. FIG. 22B schematically shows the cross section of a semiconductor device in which a chip 908 for the MCU core and the common section is connected with a peripheral circuit section chip 907 or 909 by utilizing the MCM technologies.

By grouping the circuits so as to be formed on the "MCU core section chip" (or a "chip for the MCU core and the common section") and the peripheral circuit section chip, the following advantages can be obtained. If the circuit blocks commonly used for the two kinds of MCUs are formed on one and the same semiconductor chip, then the circuit area of the semiconductor device consisting of the two chips is reduced as a whole and the production yield is increased. In addition, in the case where an MCU is newly designed or in the case where the design of the MCU is changed, it is sufficient to newly design peripheral circuits with a relatively small size or change the design thereof without changing the design of the MCU core. Moreover, only the newly designed peripheral circuits are required to be tested, so that it is not necessary to additionally provide a test circuit. As a result, a cost for developing a semiconductor device can be reduced as a whole.

According to the present invention, by forming a first circuit block and a second circuit block respectively having different block parameters on different semiconductor chips and electrically connecting these circuit blocks, it is possible to solve various problems caused by the circuit where a plurality of circuit blocks having different block parameters are integrated on one and the same semiconductor chip.

In particular, by classifying the circuit blocks into two groups and separately forming the two groups of circuit blocks on a memory core section chip formed by performing a first semiconductor fabrication process and a memory peripheral circuit section chip formed by performing a second semiconductor fabrication process different from the first semiconductor fabrication process, only the memory core section chip is required to be formed by an expensive memory process and the memory peripheral circuit section chip can be formed by an inexpensive logic LSI process, so that the cost for fabricating a semiconductor memory device can be advantageously reduced.

In addition, the expensive process is required only for the memory core section laid out at the pitch of the memory cells in the memory core section chip, so that the memory peripheral circuit section as well as the signal processor can be fabricated by performing a semiconductor fabrication process at a lower cost as compared with the expensive memory process. Accordingly, when a large-scale signal processor is formed in the signal processing chip, the increase in the size of the signal processing chip with a memory peripheral circuit section can be considerably reduced as compared with a signal processing chip without a memory peripheral circuit section. Moreover, the provision of the memory peripheral circuit section hardly reduces the production yield of the chip and scarcely increases the cost thereof, thereby effectively lowering the cost of the semiconductor device forming the system.

Furthermore, by connecting a memory core section chip which includes memory cells for storing a data therein and is formed by performing a first semiconductor fabrication process, and a signal processing chip which includes a memory peripheral circuit section and a signal processor for processing a signal using the data stored in the memory core section chip and is formed by performing a second semiconductor fabrication process different from the first semiconductor fabrication process, the data can be transmitted at a high rate between the signal processing chip and the memory core section chip, thereby effectively improving the performance of the system. Moreover, by transmitting a plurality of data and processing the data in parallel, the system can effectively operate at a low voltage and a low power consumption, and the system can be produced at a lower cost.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A memory peripheral circuit section chip comprising:
   an input/output terminal for transmitting/receiving a signal to/from another semiconductor memory core chip having a memory cell array, and
   a memory peripheral circuit for designating a memory cell of the memory cell array in the semiconductor memory core chip based on a given address so as to read/write a data from/onto the memory cell.

2. A memory core chip comprising:
   an input/output terminal for transmitting/receiving a signal to/from another semiconductor chip having a memory peripheral circuit, and
   a memory cell array,
   wherein a memory cell is designated by the memory peripheral circuit of the semiconductor chip based on a given address so as to read/write a data from/onto the memory cell.

3. A semiconductor device comprising a memory chip and a signal processing chip which are mounted on one and the same substrate,
   wherein the memory chip comprises: a memory cell array section including a plurality of memory cells for storing a data therein; an access means for designating a memory cell in the memory cell array section based on a given address so as to input/output data thereto/therefrom; and a data terminal for inputting/outputting a plurality of data in parallel,
   and wherein the signal processing chip comprises a data terminal for inputting/outputting a plurality of data in parallel,
   and wherein a means for transmitting a plurality of data in parallel between the memory chip and the signal processing chip is provided.

4. A semiconductor device according to claim 3, wherein the memory chip is formed by performing a first semiconductor fabrication process,
   and wherein the signal processing chip is formed by performing a second semiconductor fabrication process which is different from the first semiconductor fabrication process.

5. A semiconductor device according to claim 3, wherein the signal processing chip further comprises a plurality of signal processors.

6. A semiconductor device comprising a memory core section chip and a signal processing chip which are mounted by utilizing multi-chip module mounting technologies,
   wherein the memory core section chip comprises: a memory cell array including a plurality of memory cells for storing a data therein; and a data terminal for inputting/outputting a plurality of data in parallel,
   and wherein the signal processing chip comprises a data terminal for designating a memory cell in the memory core section chip based on a given address so as to read/write a data from/onto the memory cell and input/output a plurality of data in parallel, and a plurality of signal processors,
   and wherein a means for transmitting a plurality of data in parallel between the memory core section chip and the signal processing chip is provided.

7. A semiconductor memory device according to claim 6, wherein the memory core section chip is formed by performing a first semiconductor fabrication process,
   and wherein the signal processing chip is formed by performing a second semiconductor fabrication process which is different from the first semiconductor fabrication process.

* * * * *